US006781152B2

(12) United States Patent
Yamazaki

(10) Patent No.: US 6,781,152 B2
(45) Date of Patent: Aug. 24, 2004

(54) SEMICONDUCTOR DEVICE WITH LIGHT EMITTING ELEMENTS AND AN ADHESIVE LAYER HOLDING COLOR FILTERS

(75) Inventor: Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 09/774,388

(22) Filed: Jan. 30, 2001

(65) Prior Publication Data

US 2001/0040645 A1 Nov. 15, 2001

(30) Foreign Application Priority Data

Feb. 1, 2000 (JP) ........................................ 2000-024540

(51) Int. Cl.[7] ....................... H01L 29/04; H01L 31/036; H01L 31/0376; H01L 31/20
(52) U.S. Cl. .......................... 257/59; 257/72; 257/294; 257/98
(58) Field of Search .......................... 257/59, 72, 294, 257/347, 98; 349/42, 44, 106, 107, 108, 109

(56) References Cited

U.S. PATENT DOCUMENTS

| 5,206,749 | A | 4/1993 | Zavracky et al. |
|---|---|---|---|
| 5,247,190 | A | 9/1993 | Friend et al. |
| 5,317,236 | A | 5/1994 | Zavracky et al. |
| 5,376,561 | A | 12/1994 | Vu et al. |
| 5,399,502 | A | 3/1995 | Friend et al. |
| 5,643,826 | A | 7/1997 | Ohtani et al. |
| 5,654,811 | A | 8/1997 | Spitzer et al. |
| 5,757,456 | A | 5/1998 | Yamazaki et al. |
| 5,781,164 | A | 7/1998 | Jacobsen et al. |
| 5,821,138 | A | 10/1998 | Yamazaki et al. |
| 5,834,327 | A | 11/1998 | Yamazaki et al. |
| 5,923,962 | A | 7/1999 | Ohtani et al. |
| 6,043,800 | A | 3/2000 | Spitzer et al. |
| 6,118,502 | A | 9/2000 | Yamazaki et al. |
| 6,274,887 | B1 | 8/2001 | Yamazaki et al. |
| 6,376,333 | B1 | 4/2002 | Yamazaki et al. |
| 6,445,005 | B1 | 9/2002 | Yamazaki et al. |

FOREIGN PATENT DOCUMENTS

| EP | 0999595 A2 | 5/2000 |
|---|---|---|
| EP | 1085576 A2 | 3/2001 |
| GB | 2319650 A | 5/1998 |
| JP | 07-130652 | 5/1995 |
| JP | 08-096959 | 4/1996 |
| JP | 08-146402 | 6/1996 |
| JP | 08-254686 | 10/1996 |
| JP | 08-288522 | 11/1996 |
| JP | 09-063770 | 3/1997 |
| JP | 09-312260 | 12/1997 |
| JP | 10-092576 | 4/1998 |
| JP | 10-161104 | 6/1998 |
| JP | 10-247735 | 9/1998 |
| JP | 10-270363 | 10/1998 |
| JP | 11-191628 | 7/1999 |
| JP | 2001-175198 | 6/2001 |
| WO | WO 90/13148 | 11/1990 |

OTHER PUBLICATIONS

Schenk, et al., "Polymers for Light Emitting Diodes", Euro-Display '99 Proceedings, pp. 33–37.

Hong, et al., "New Approaches to Process Simplification for Large Area and High Resolution TFT–LCD", IDMC 2000, pp. 219–223.

Primary Examiner—Thien Tran
(74) Attorney, Agent, or Firm—Fish & Richardson P.C.

(57) ABSTRACT

A high performance electric device which uses an adhesive layer over a substrate. A color filter is over a substrate, and an adhesive layer is also located over the substrate and color film. An insulating layer is over the adhesive layer, and thin film transistors cover the insulating film and the color filters. Light emitting elements cover the thin film transistors and emit light through the substrate that is through the adhesive layer and color filter. The substrate may be plastic, thus increasing the heat resistance.

35 Claims, 22 Drawing Sheets

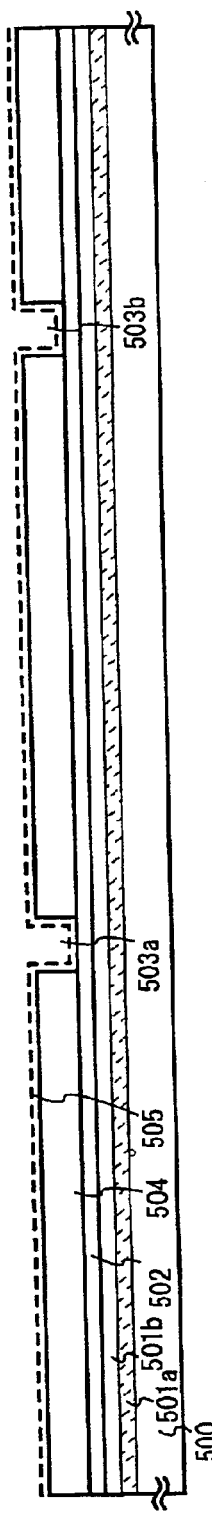
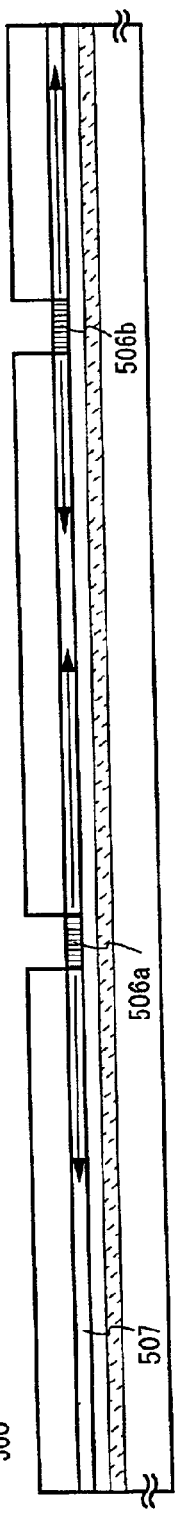
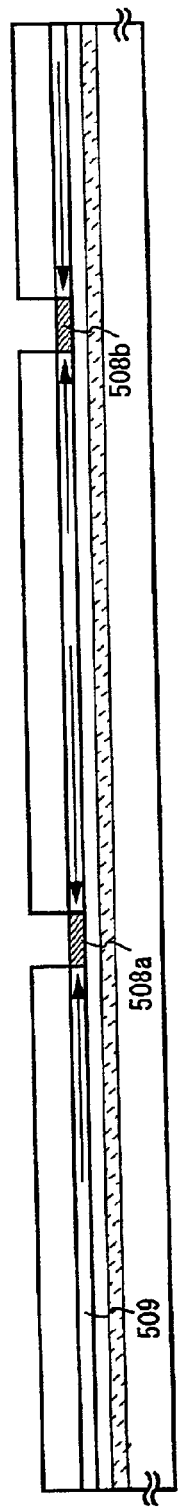
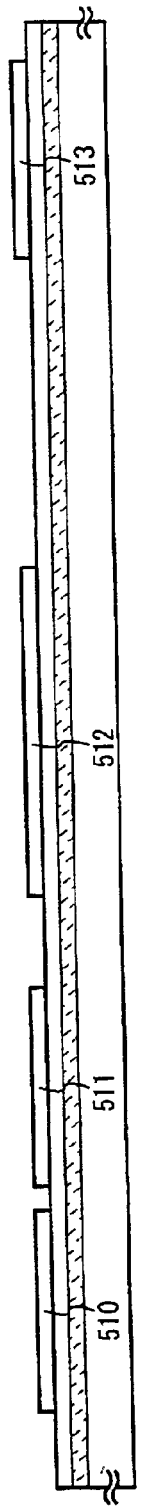
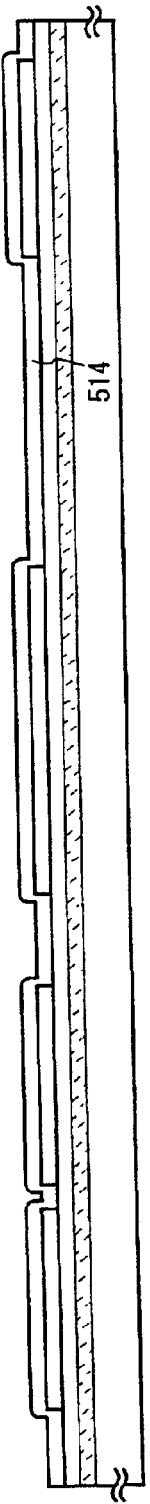

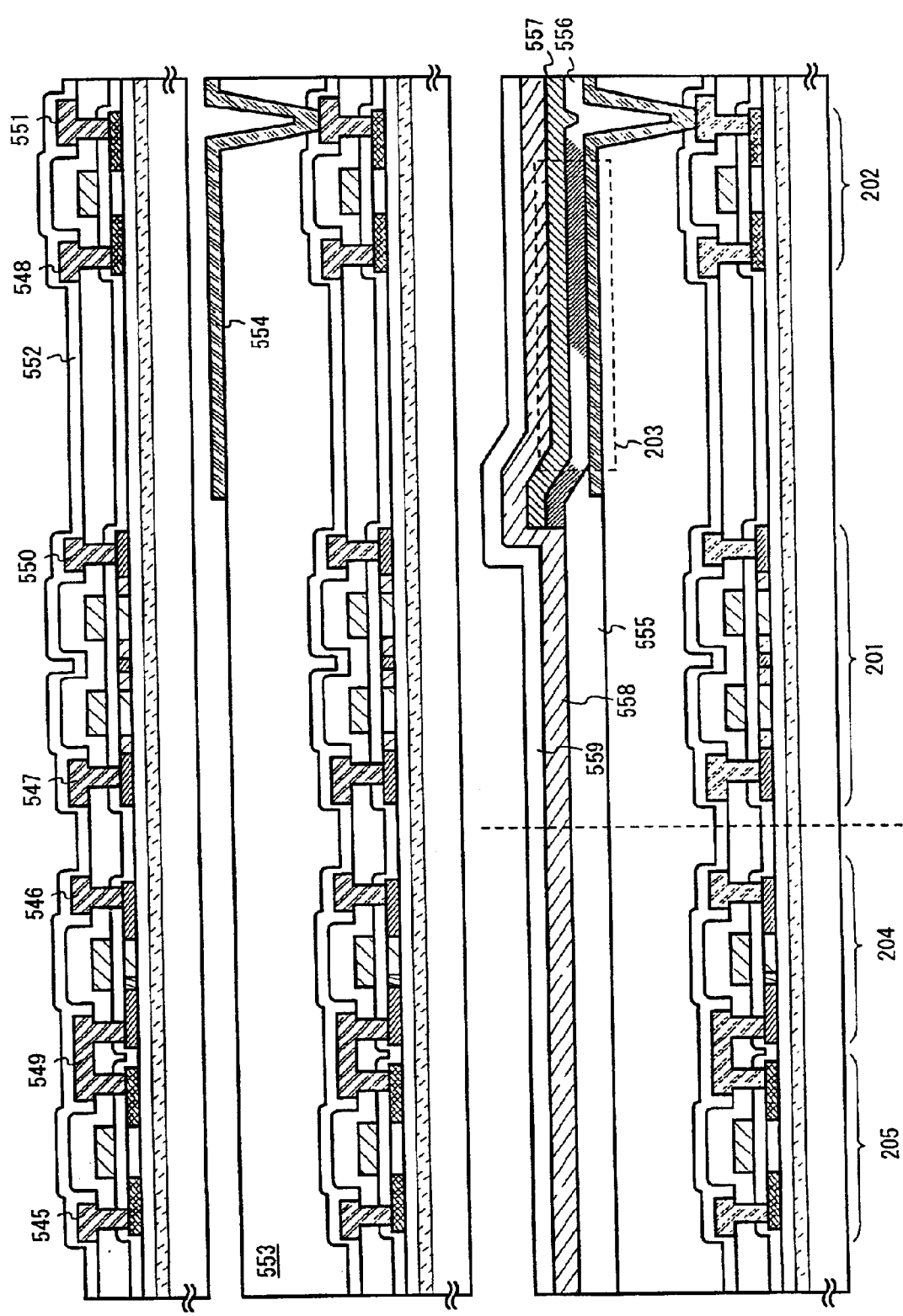

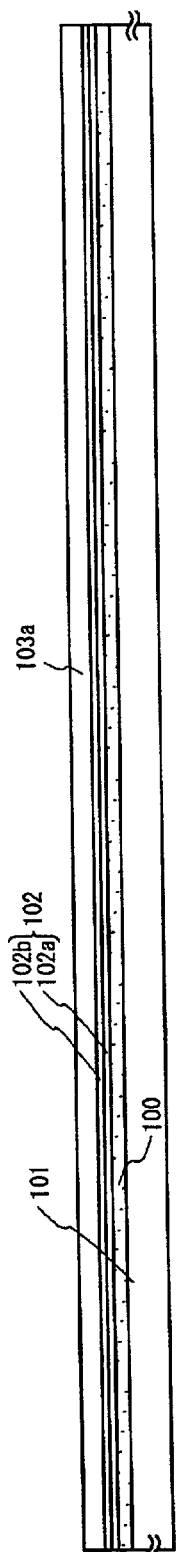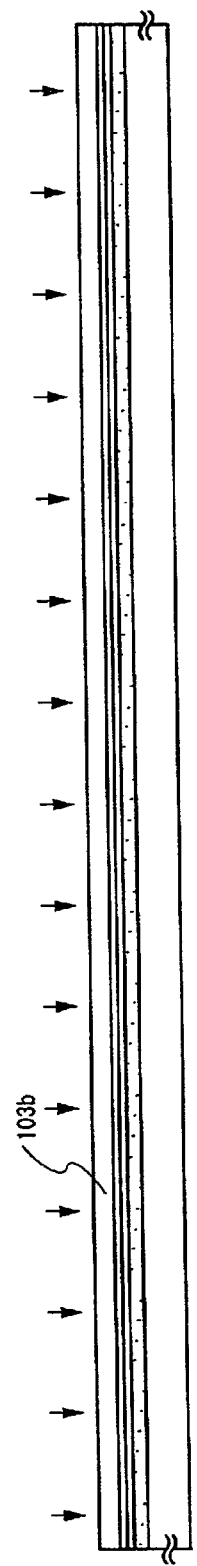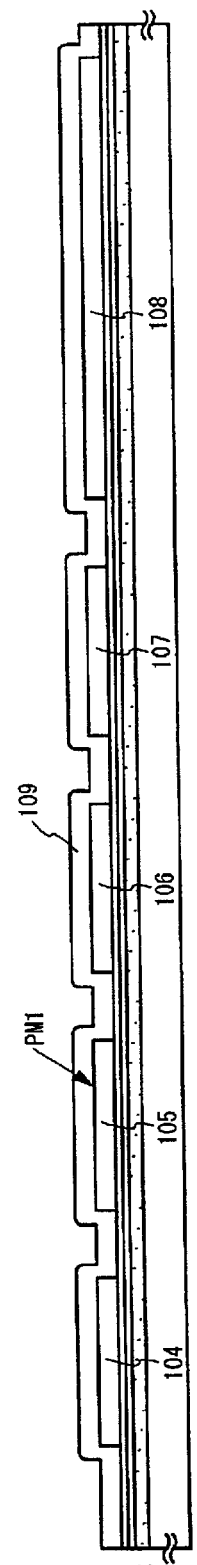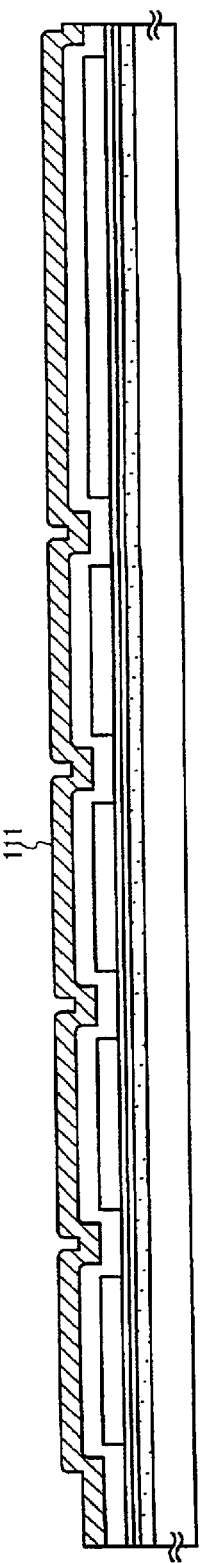
FIG. 16A
FIG. 16B
FIG. 16C
FIG. 16D

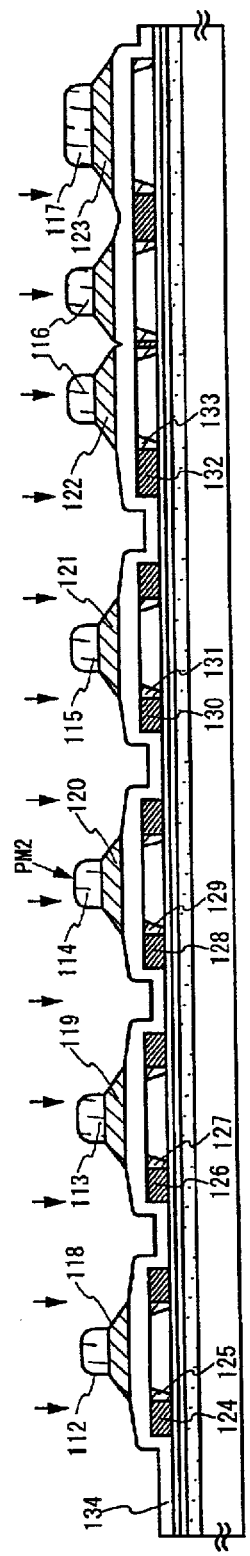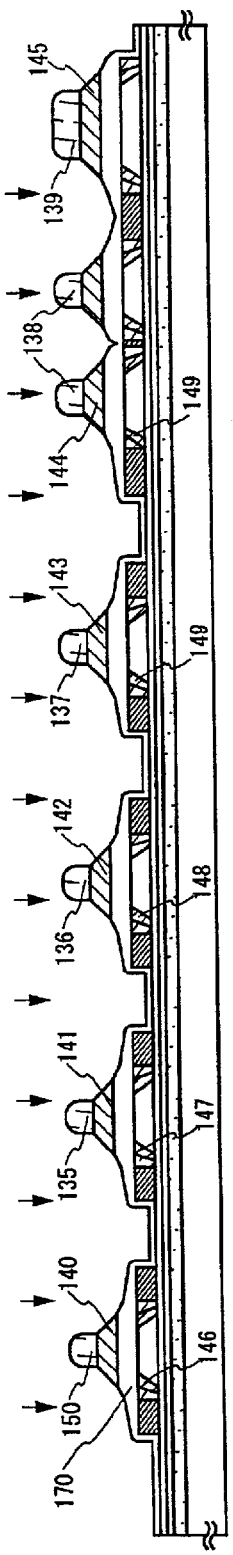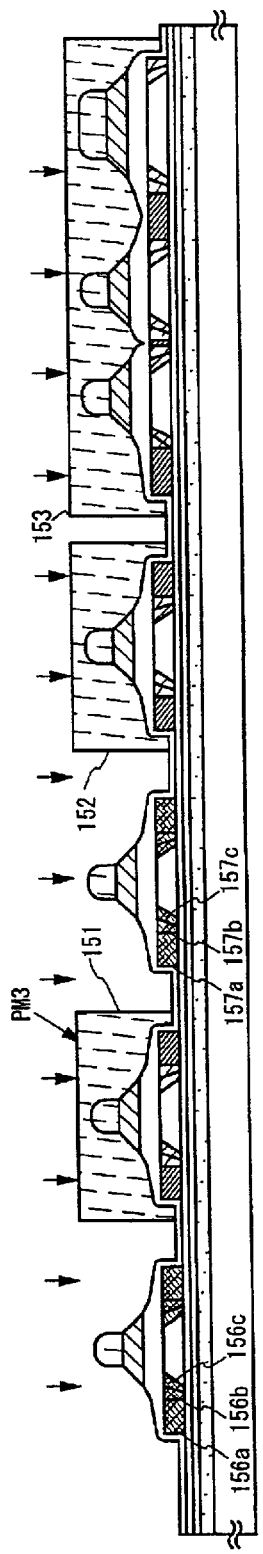

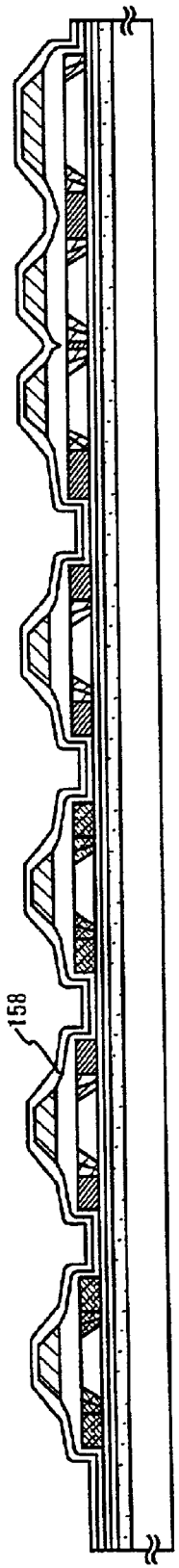
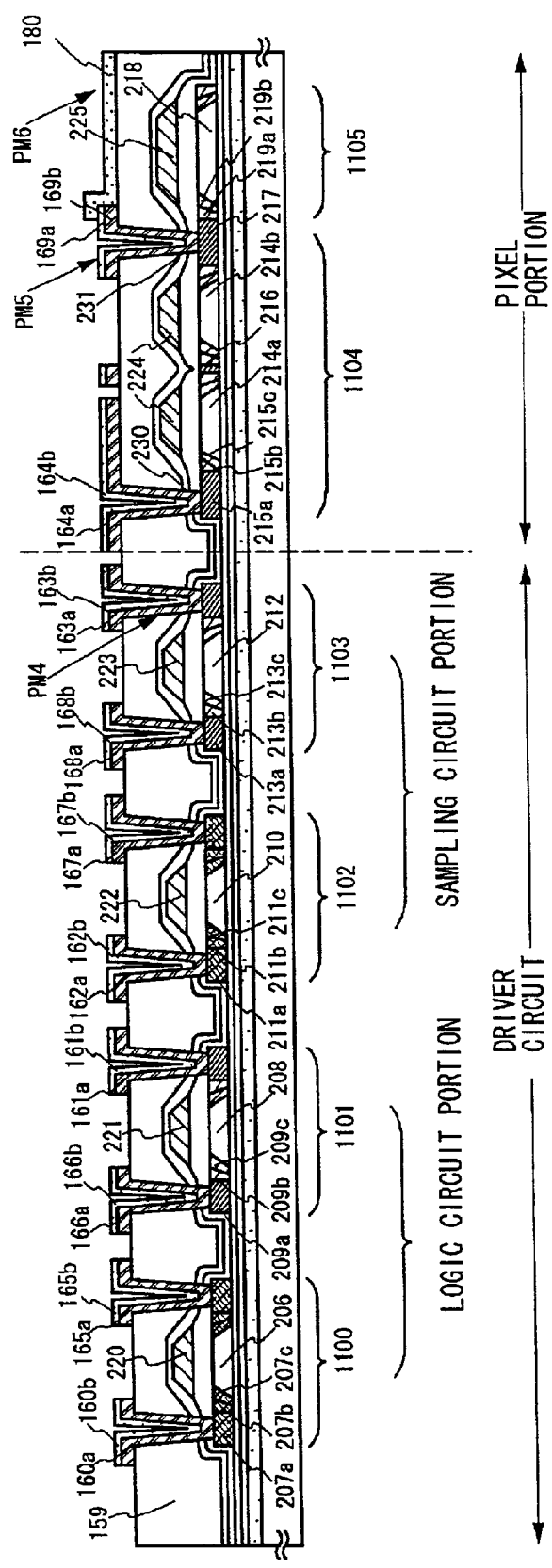
FIG. 18A
FIG. 18B

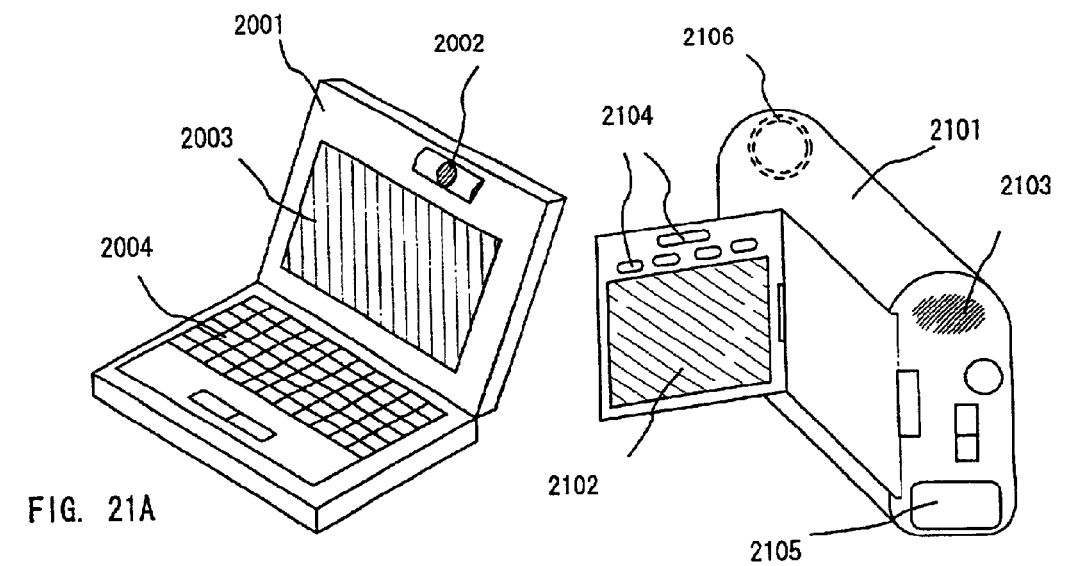
FIG. 21A
FIG. 21B
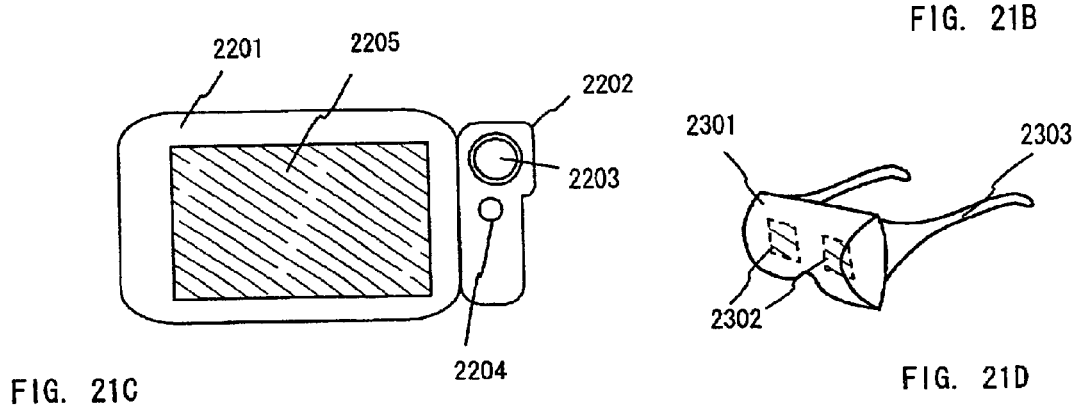
FIG. 21C
FIG. 21D
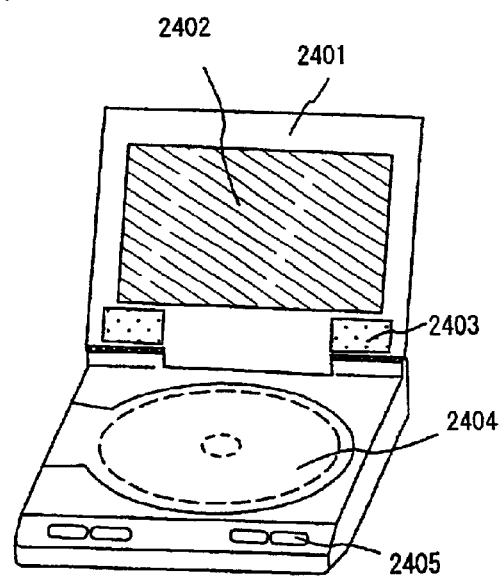
FIG. 21E
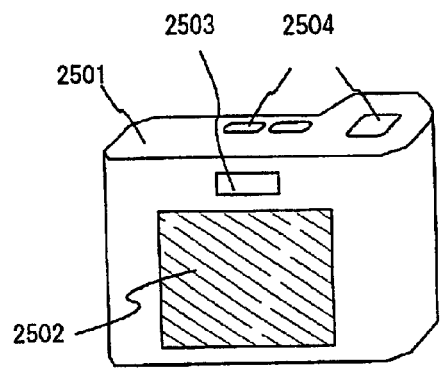
FIG. 21F

SEMICONDUCTOR DEVICE WITH LIGHT EMITTING ELEMENTS AND AN ADHESIVE LAYER HOLDING COLOR FILTERS

BACKGROUND OF THE INVENTION

1. Field of the Invention

The present invention relates to a semiconductor device which includes therein a device (hereinafter referred to as a light emitting device) having an element where a light emitting material is sandwiched between electrodes (hereinafter referred to as a light emitting element) or a device (hereinafter referred to as a liquid crystal display device or a liquid crystal module) having an element where liquid crystal is sandwiched between electrodes (hereinafter referred to as a liquid crystal element), and a method of manufacturing thereof. For example, the present invention relates to an electric device represented by a liquid crystal display device and a light emitting device and to an electronic equipment (electronic apparatus) having such an electric device (electronic device) mounted thereon as a component.

It is to be noted that, as used herein, the term "semiconductor device" refers to any device which can function by utilizing semiconductive characteristics, including an electric device, a semiconductor circuit, and an electronic apparatus.

2. Description of the Related Art

These days, attention is attracted to technology for forming a thin film transistor (hereinafter referred to as a TFT) using a semiconductor thin film (at the thickness of several to several hundred nm) formed on a substrate having an insulating surface. A thin film transistor is widely applied to electronic devices such as an IC and an electric device. In particular, a thin film transistor as a switching element in a liquid crystal display device and in a light emitting device is actively developed for practical use.

Also, recent trend toward lighter devices in weight has induced attempt to form a light emitting element or a TFT on a flexible plastic film. However, the present situation is that a satisfactory TFT compared with one formed on a glass substrate has not been manufactured as yet.

Development of a light emitting device (also called a light emitting diode or an electroluminescent (EL) device, and hereinafter referred to as an EL display device or an EL module) using a light emitting element (hereinafter referred to as an EL element) utilizing an electroluminescent light emitting material (hereinafter referred to as an EL material) is making progress. An EL display device is structured to comprise an EL element where an EL material is sandwiched between an anode and a cathode. By applying voltage between the anode and the cathode, electric current is made to pass through the EL material, carriers are made to recombine, and light is emitted. Since, in this way, a light emitting element itself has the ability of emitting light in an EL display device, a backlight which is used in a liquid crystal display device is unnecessary. In addition, an EL display device has a wide angle of visibility, is light in weight, and has low power consumption.

To make the EL display device capable of displaying colors, there are methods: a method where EL elements emitting red, green, and blue colors are arranged in a matrix; and a method where EL elements emitting white light are used together with color filters.

In an EL display device where EL elements emitting red, green, and blue colors are used, since different EL materials are used to form EL elements emitting the respective colors, the element characteristics differ accordingly, and it is difficult to obtain uniform display.

In a color EL display device where EL elements emitting white light are used together with color filters, R (red), G (green), and B (blue) color filters are formed at positions corresponding to pixels, thereby changing colors of light to be taken out from the respective pixels. It is to be noted that, positions corresponding to pixels mean positions aligned with pixel electrodes. The color filters have an R (red), G (green), or B (blue) coloring layer, and a color shielding mask provided, except at positions corresponding to gaps of pixels. By making light transmit the color filters, red, green, and blue light are extracted. The light shielding mask of the color filters generally comprises a metal film or an organic film containing black pigment.

In a liquid crystal display device, TFTs using semiconductor of amorphous silicon or polysilicon are arranged in a matrix. A liquid crystal material is sandwiched between an element substrate where pixel electrodes, source lines, and gate lines connected to the respective TFTs are formed, and an opposing substrate having an opposing electrode disposed so as to face the element substrate. Color filters for color display is formed on the opposing substrate. In principle, such a liquid crystal display device is similar to that of the EL display device using the color filters as described above. Further, a polarizing plate is disposed as a light shutter on each of the element substrate and the opposing element to display a color image.

Also, a liquid crystal device using a metal film as the light shielding mask has a problem that signal delays are liable to occur due to parasitic capacitance formed between the metal film and other wirings. A liquid crystal device using an organic film to insulate the light shielding mask from other wirings has a problem that the number of the manufacturing processes increases.

SUMMARY OF THE INVENTION

An object of the present invention is to provide technology for manufacturing a high performance electric device using a plastic support (including a plastic film and a plastic substrate).

The present invention is characterized in that, after necessary elements are formed on a substrate having better heat resistance compared with plastic (a glass substrate, a quartz substrate, a silicon substrate, a metal substrate, or a ceramic substrate), the elements are moved onto a plastic support by a process at room temperature.

It is to be noted that the above necessary elements refer to, in case of an active matrix electric device, a semiconductor element (typically a TFT) used as a switching element of a pixel, an MIM element, and a light emitting element.

As the plastic support, PES (polyethylene sulfite), PC (polycarbonate), PET (polyethylene terephthalate), or PEN (polyethylene naphthalate) may be used.

According to an aspect of the present invention, a semiconductor device comprising an adhesive layer on a substrate, an insulating film on the adhesive layer, and light emitting elements on the insulating film is characterized in that light emitted from the light emitting elements is emitted through the substrate.

In the semiconductor device, the substrate is a plastic substrate comprising an organic material. Further, the semiconductor device further comprises driver circuits on the insulating film, and the light emitting elements and the driver circuits comprise TFTs.

Further, in the semiconductor device, color filters are provided on the substrate at positions aligned with the light emitting elements. It is to be noted that a color filter herein refers to one patterned coloring layer (single color). Further, the semiconductor device is characterized in that the insulating film covers the color filters and is planarized. Further, the semiconductor device is characterized in that red color filters of the color filters are provided at positions aligned with at least the channel forming regions of the TFTs.

Further, in the semiconductor device, a fixing substrate is provided over the light emitting elements so as to face the substrate.

According to another aspect of the present invention, a semiconductor device having a first substrate comprising an organic material and having TFTs provided thereon, a second substrate, and a liquid crystal material retained between the first and second substrates is characterized in that color filters are provided between the first substrate and the TFTs.

In the semiconductor device, the first substrate comprising an organic material is a plastic substrate. Further, the semiconductor device is characterized by further comprising an insulating film covering the color filters and planarized. Further, the semiconductor device is characterized in that the color filters are provided at positions aligned with at least the channel forming regions of the TFTs. Further, the semiconductor device is characterized by further comprising a black mask together with the color filters.

According to still another aspect of the present invention, a method of manufacturing a semiconductor device comprising the steps of forming a separating layer on a first substrate, forming an insulating film on the separating layer, forming light emitting elements on the insulating film, attaching a fixing substrate on the light emitting elements using a first adhesive layer, removing the separating layer by exposing the separating layer to gas containing halogen fluoride to separate the first substrate, and attaching a second substrate to the insulating film using a second adhesive layer, is characterized in that the second substrate has color filters provided thereon.

The method of manufacturing a semiconductor device is characterized in that the second substrate is a plastic substrate. Further, the method is characterized in that the separating layer is a film comprising silicon.

Further, the method is characterized in that the color filters are aligned with the active layer as seen from the side of the second substrate. Further, the method is characterized in that the color filters aligned with the active layer are red color filters.

According to yet another aspect of the present invention, a method of manufacturing a semiconductor device comprising the steps of forming a separating layer on a first substrate, forming an insulating film on the separating layer, forming an active layer, a gate insulating film, and gate electrodes on the insulating film, forming a first interlayer insulating film so as to cover the gate electrodes, forming wiring and pixel electrodes on the first interlayer insulating film, attaching a fixing substrate provided with an opposing electrode on the first substrate using a sealant, injecting liquid crystal between the pixel electrodes and the opposing electrode, removing the separating layer by exposing the separating layer to gas containing halogen fluoride to separate the first substrate, and attaching a second substrate to the insulating film using an adhesive layer, is characterized in that the second substrate has color filters provided thereon.

Further, the method is characterized in that the color filters are aligned with the active layer seen from the side of the second substrate. Further, the method is characterized in that the color filters aligned with the active layer are red color filters.

The method is characterized in that the second substrate is a plastic substrate. Further, the method is characterized in that the fixing substrate is a light transmitting substrate.

Further, the method is characterized in that the separating layer is a film comprising silicon.

The step of removing the separating layer to separate the first substrate may be performed using a conventional method, for example, silicon may be used as the separating layer, and the separation may be performed by irradiating a laser beam.

BRIEF DESCRIPTION OF THE DRAWINGS

In the accompanying drawings:

FIGS. 4A–4E illustrate a manufacturing process of an EL display device of Embodiment 1;

FIGS. 7A–7C illustrate the manufacturing process of the EL display device of Embodiment 1;

FIGS. 16A–16D illustrate a manufacturing process of a display device according to the present invention;

FIGS. 17A–17C illustrate the manufacturing process of the display device according to the present invention;

FIGS. 18A–18B illustrate the manufacturing process of the display device according to the present invention;

FIGS. 21A–21F illustrate examples of electronic apparatuses; and

DETAILED DESCRIPTION OF THE PREFERRED EMBODIMENTS

Embodiment modes according to the present invention are now described in the following.

(Embodiment Mode 1)

Figure 1:
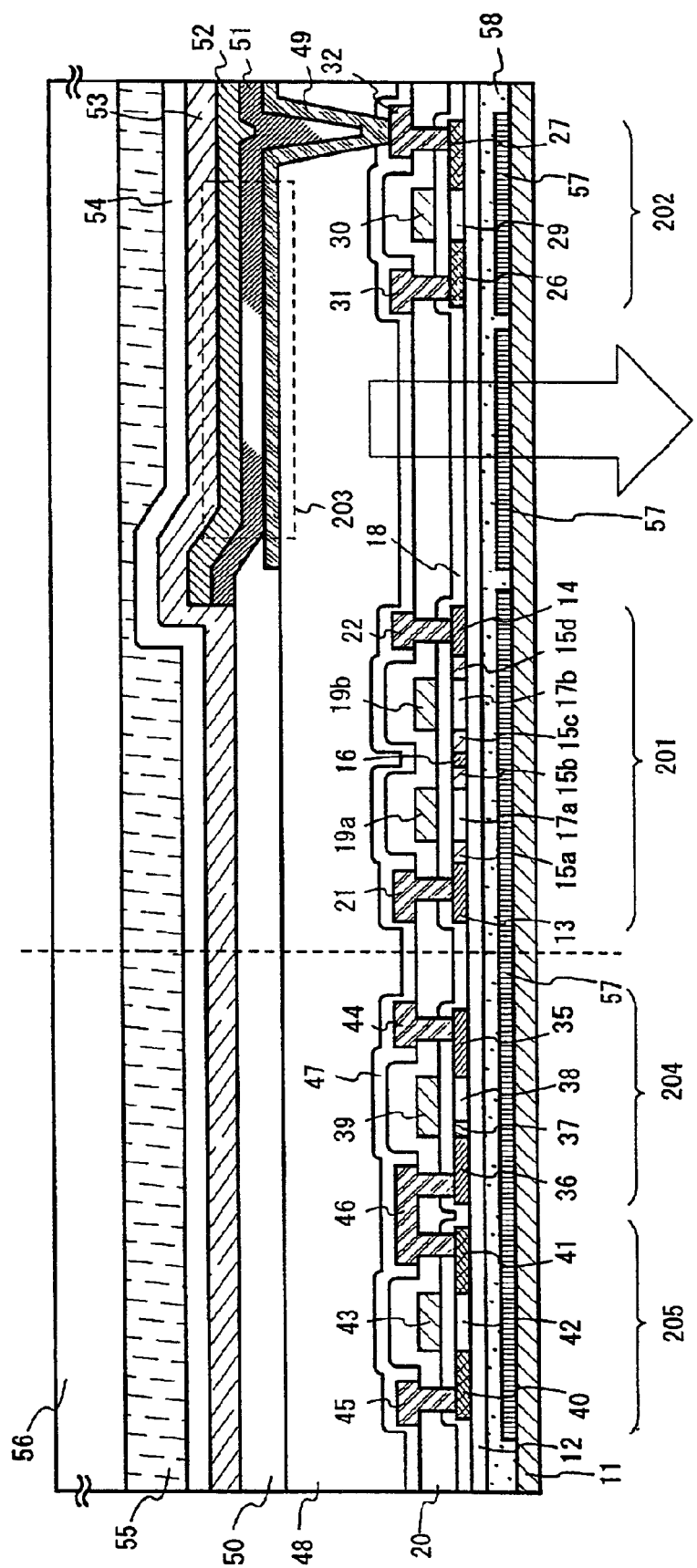
FIG. 1 illustrates an EL display device according to the present invention.

FIG. 1 illustrates an EL display device according to the present invention.

An underlayer film 12 is attached to a plastic substrate (a second substrate) 11 using a second adhesive layer 58. A switching TFT 201 and a current controlling TFT 202 for forming a pixel portion, and an p-channel TFT 205 and a n-channel TFT 204 forming a driver circuit are provided on the underlayer film 12. It is to be noted that the respective TFTs include an active layer of the respective TFTs (including the channel forming regions 17a, 17b, 29, 38, and 42, source regions 13, 26, 35, and 40, drain regions 14, 27, 36, and 41, and LDD regions 15a, 15b, 15c, 15d, and 37), a gate insulating film 18 covering the active layer, gate electrodes 19a, 19b, 30, 39, and 43 aligned with the channel forming regions through the gate insulating film, a first interlayer insulating film 20 covering the gate electrodes, source wirings 21, 31, 44 and 45 and drain wirings 22, 32, and 46 on the first interlayer insulating film 20 and reaches the active layer, a first passivation film 47 covering the source wirings and the drain wirings, and a second interlayer insulating film 48 covering the first passivation film 47. It is to be noted that, in the TFT 202 for controlling current, a pixel electrode (an anode) 49 is on the second interlayer insulating film 48 and reaching the drain wiring 32, an EL layer 51 is on the pixel electrode 49, a cathode 52 is on the EL layer 51, and a protective electrode 53 is on the cathode 52.

Further, a first adhesive layer 55 is provided for attaching a second passivation film 54 covering the protective electrode 53 to a fixing substrate 56. The fixing substrate 56 is for fixing the elements when the elements are separated from the substrate, and may be a glass substrate, a quartz substrate, a ceramic substrate, a silicon substrate, or a plastic substrate.

The direction of light emission of the EL display device illustrated in FIG. 1 is the direction shown by an arrow in FIG. 1. The emitted light goes through the color filters 57 and the second substrate 11 to be emitted.

Figure 2:
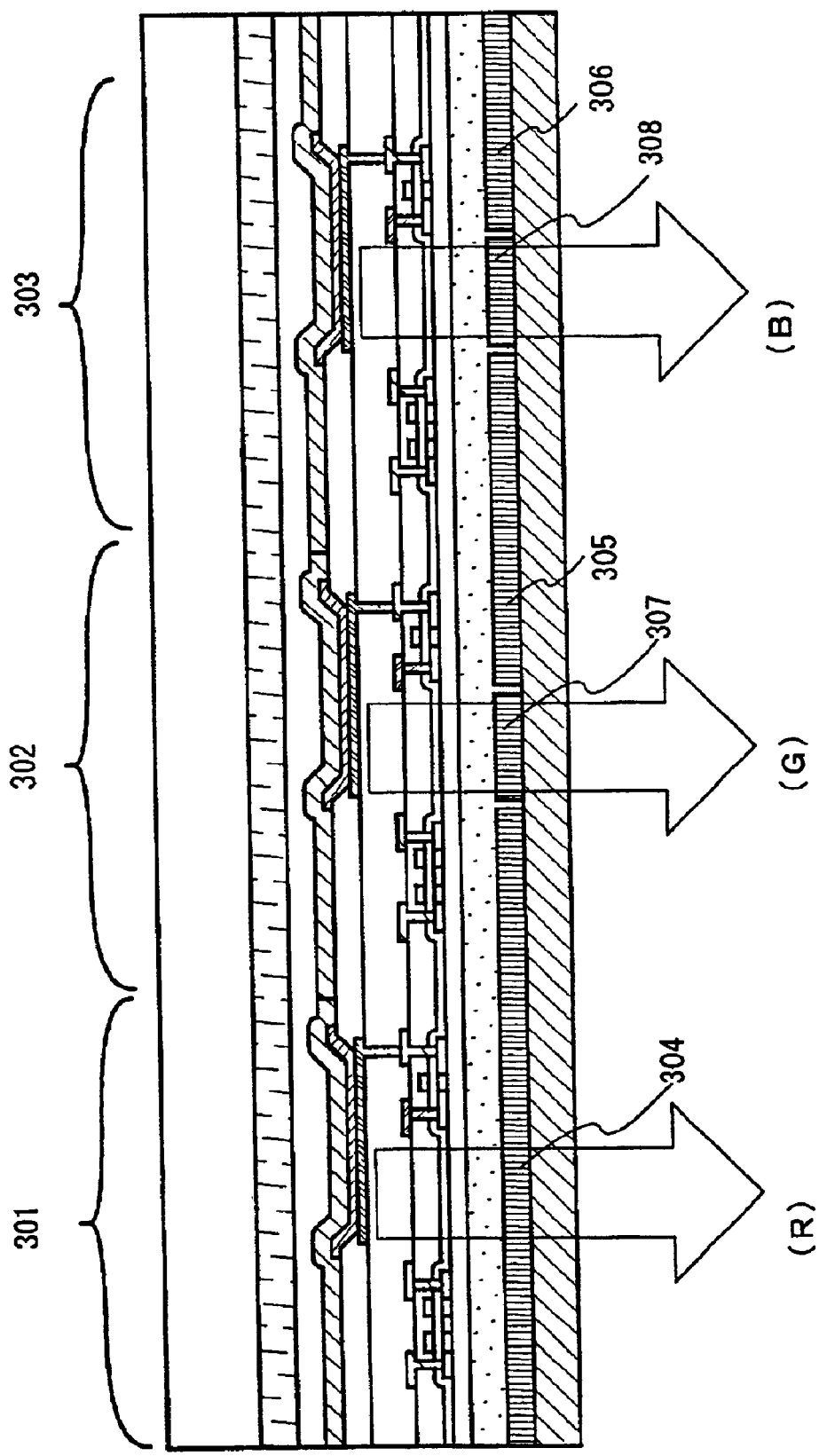
FIG. 2 illustrates the direction of light emission in the respective pixels.
Figure 3:
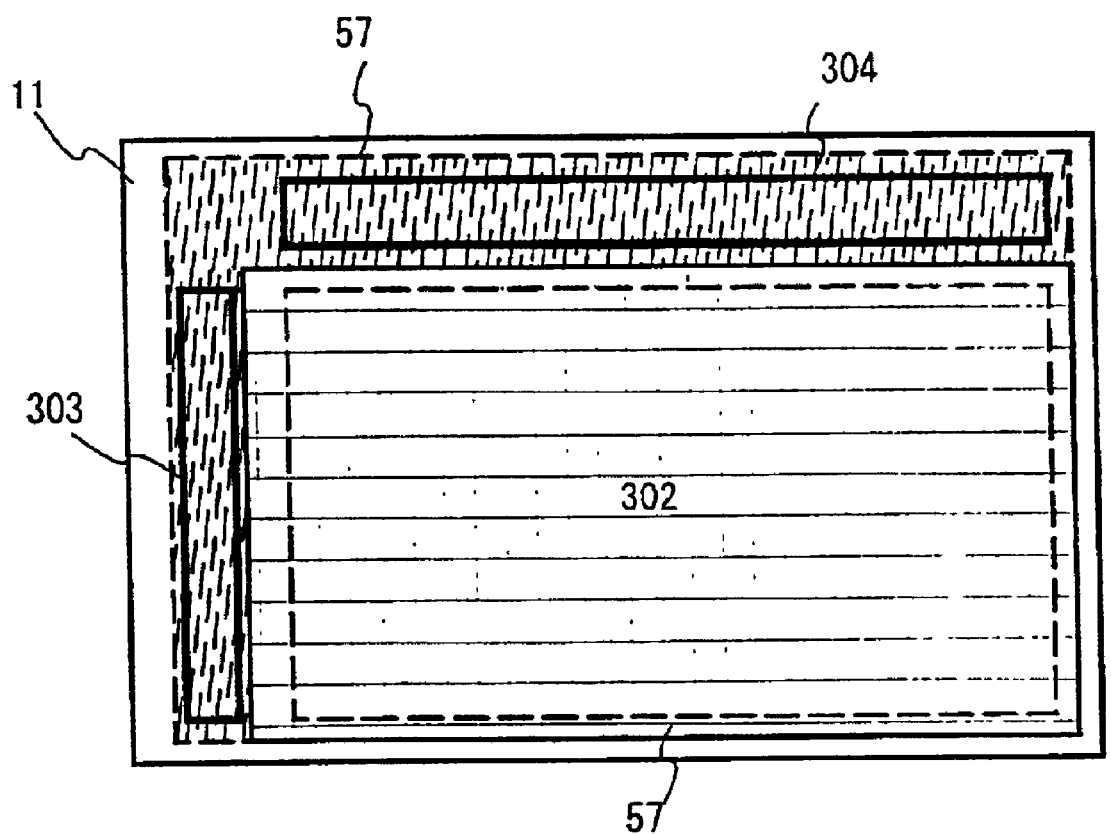
FIG. 3 is a plan view of the EL display device according to the present invention.
Figure 20:
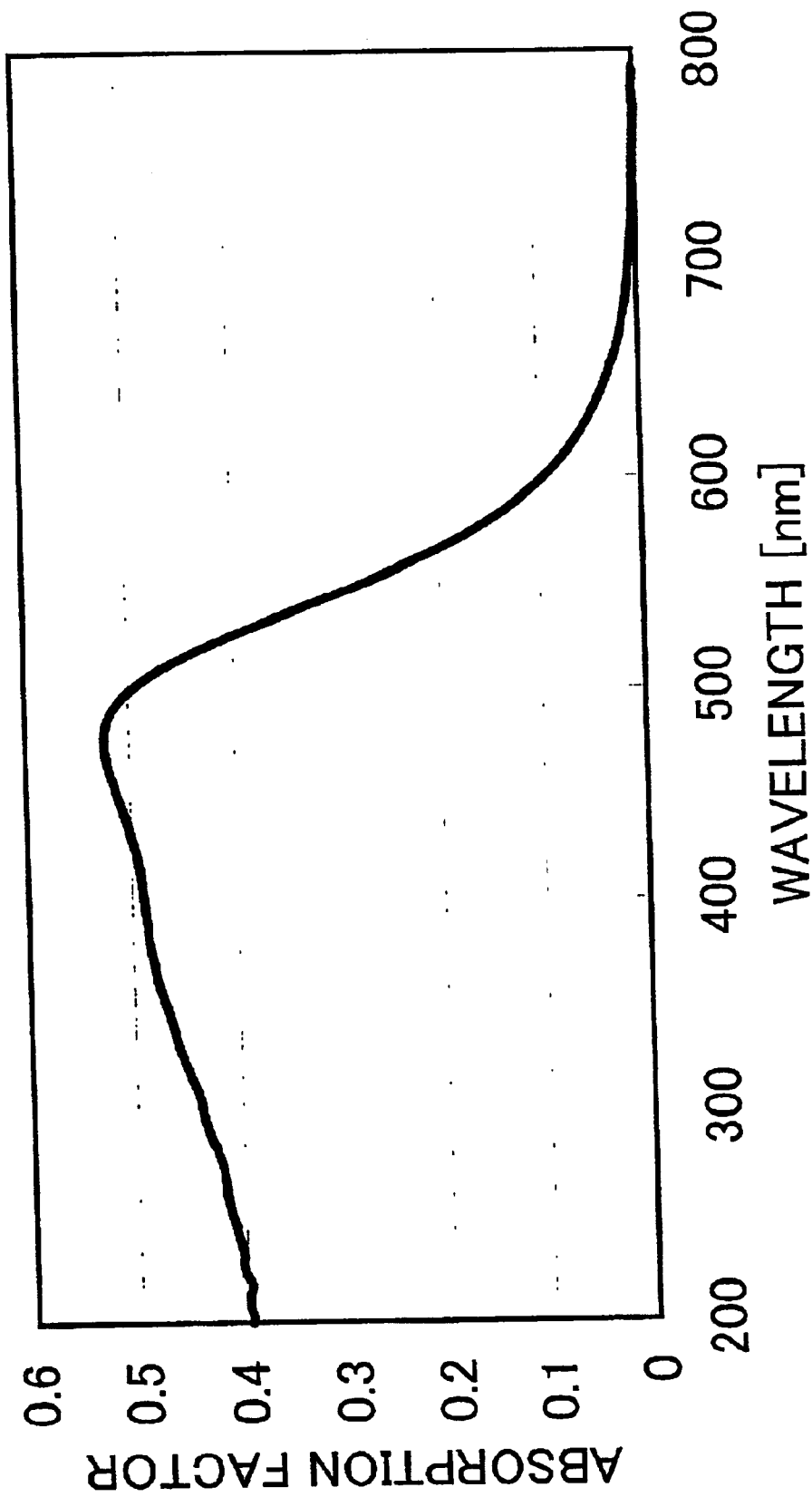
FIG. 20 illustrates the absorption ratio with regard to a non-single-crystalline silicon film.

One of the characteristics of the present invention is that the color filters 57 are provided on the attaching surface side of the second substrate 11. Further, as illustrated in FIG. 3, another characteristic of the present invention is that the color filters 57 are arranged on the second substrate 11 as a light shielding film for the TFT elements of a driver circuit portion (a gate line side driver circuit 303 and a source line side driver circuit 304) and of a pixel portion 302. Further, FIG. 2 illustrates an example of arrangement of color filters 304 to 308 corresponding to a pixel portion (R) 301, a pixel portion (G) 302, and a pixel portion (B) 303, respectively. In particular, in case the color filters are used as a light shielding film, the red color filters are effective since the wavelength of light passing therethrough is short and has almost no influence on a non-single-crystalline silicon film. For reference, FIG. 20 illustrates the relationship between the absorption ratio with regard to a non-single-crystalline silicon film at the thickness of 55 nm and the wavelength of irradiated light.

According to the present invention, in order to protect the device from deterioration due to light, a color filter (R) is formed below the gate electrodes of the TFTs, that is, below the channel forming regions.

Further, with regard to the arrangement of the color filters, a striped pattern as the simplest one, an oblique mosaic arrangement, a triangular mosaic arrangement, an RGBG four-pixel arrangement, an RGBW four-pixel arrangement, or the like may be used.

It is to be noted that a protective insulating film may be formed to protect the color filters on the plastic substrate. The protective insulating film plays an important role in preventing contamination due to impurity included in the color filters. By forming the protective insulating film, the color filters which are liable to deteriorate can be protected. In addition, the heat resistance can be improved. Further, an insulating film for planarization covering the color filters may be formed. In addition, a black matrix may be formed together with the color filters.

According to the present invention, a method of manufacturing a semiconductor device is characterized in that TFT elements are formed on a separating layer (at the thickness of 100 to 500 nm) comprising a silicon film (including a silicon germanium film), and in the final process, the separating layer is removed using gas containing halogen fluoride. As a result, the respective elements are separated from the substrate, which makes it possible to attach the elements to a plastic support thereafter. Since the etching of the silicon film using halogen fluoride easily proceeds at room temperature, the etching can be performed without a problem even after the light emitting elements having a low heat resistance are formed.

Halogen fluoride are materials expressed as XFn (X is halogen other than fluorine and n is an integer), including chlorine fluoride (ClF), chlorine trifluoride (ClF$_3$), bromine fluoride (BrF), bromine trifluoride (BrF$_3$), iodine fluoride (IF), and iodine trifluoride (IF$_3$). The silicon film may be a crystalline silicon film or an amorphous silicon film. Since the selection ratio of halogen fluoride between a silicon film and a silicon oxide film is large, a silicon film can be selectively etched.

It is to be noted that, though the silicon film can be etched simply by exposing the silicon film to halogen fluoride as described above, other fluorides (carbon tetrafluoride (CF$_4$) or nitrogen trifluoride) may also be used in the present invention if they are in a plasma state.

Further, the TFT elements may be separated from the substrate by one of physical action (light, heat, or the like), chemical action (reaction with chemicals or the like), or mechanical action (tensile force, vibration, or the like), or a combination thereof on the TFT elements.

This makes it possible to provide TFTs having satisfactory characteristics on the plastic substrate, and to make the EL display device further lighter in weight. Further, the assembly becomes easier.

(Embodiment Mode 2)

Figure 12:
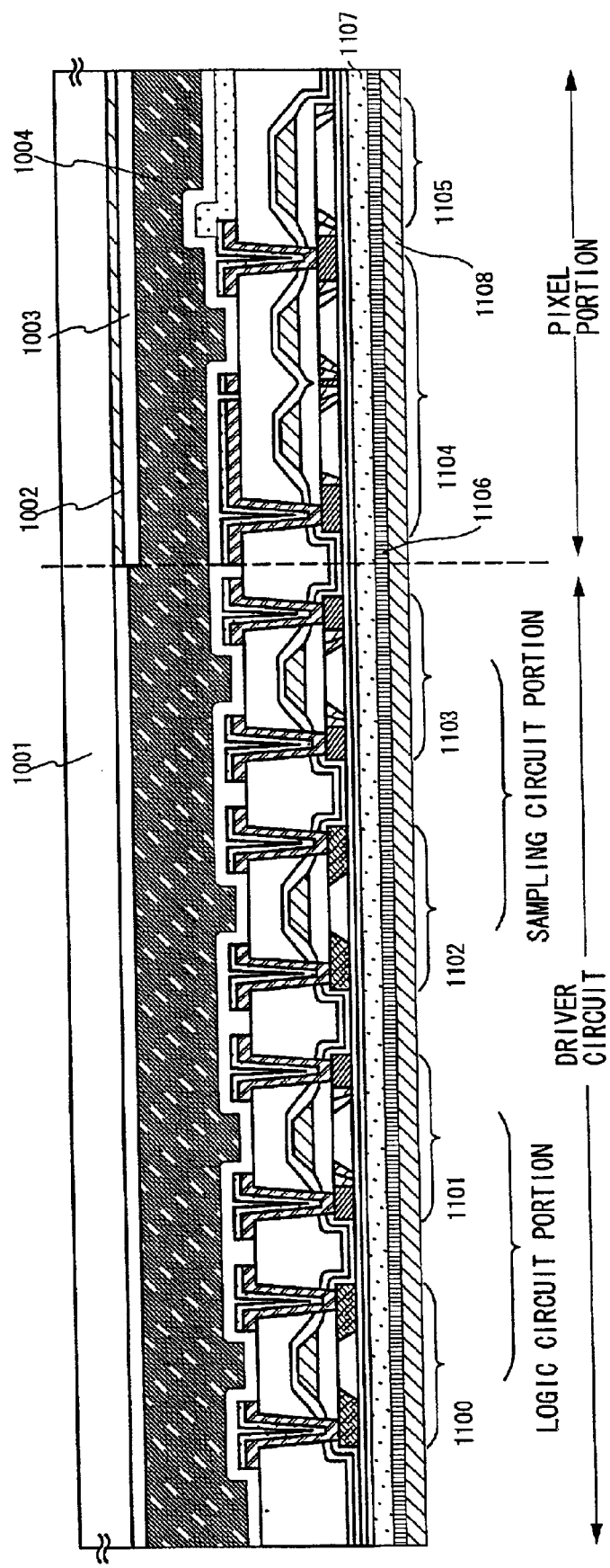
FIG. 12 is a structural view in section of an active matrix liquid crystal display device.

FIG. 12 illustrates a liquid crystal display device according to the present invention.

Color filters 1106 are provided on a second substrate (plastic substrate) 1108. The color filters 1106 are attached to an underlayer film of TFT elements using a first adhesive layer 1107. It is to be noted that, among red, blue, and green pixels, a red pixel portion is illustrated here. Further, an opposing electrode 1002 and an oriented layer 1003 are provided on the fixing substrate 1001. It is to be noted that the fixing substrate is a light transmitting substrate. The TFT elements are attached to the fixing substrate by a sealant which is not shown. Liquid crystal 1004 is sandwiched between pixel electrodes in the pixel portion and the opposing substrate 1002.

In FIG. 12, the most characteristic point is that the substrates are attached to each other with the surface having the color filters provided thereon being the inside. Further, the color filters are arranged as illustrated in FIG. 14 or FIG. 15. In case the color filters are arranged as a light shielding film for TFT elements in a driver circuit portion and in a pixel portion in this way, the red color filters are effective since the wavelength of light passing therethrough is short and has almost no influence on a non-single-crystalline silicon film. Further, since the distance between the light shielding film formed of the color filters and the semiconductor film of the TFTs is short, shielding from light can be performed efficiently.

This makes it possible to provide TFTs having satisfactory characteristics on the plastic substrate, and to make the liquid crystal display device further lighter in weight. Further, the assembly becomes easier.

The present invention structured as described in the above is described in further detail with reference to the following embodiments.

[Embodiment 1]

An embodiment according to the present invention is described with reference to FIGS. 4 to 7. Here, a method of simultaneously forming on a first substrate 500, TFTs in a pixel portion and TFTs in a driver circuit portion provided on the periphery of the pixel portion is described. It is to be noted that, for the sake of simplicity, a CMOS circuit as a basic unit is illustrated with regard to the driver circuit.

In FIG. 4A, a separating layer 501a comprising an amorphous silicon film at the thickness of 100 to 500 nm (300 nm in the present embodiment) is formed on a substrate 500 where elements are to be formed (hereinafter referred to as an element forming substrate). Though a glass substrate is used in the present embodiment as the element forming substrate (the first substrate) 500, a quartz substrate, a silicon substrate, a metal substrate, or a ceramic substrate may also be used. It is to be noted that the substrate having a semiconductor element or a light emitting element formed thereon as a whole is also herein referred to as an element forming substrate throughout this application.

The separating layer 501a may be formed by low pressure thermal CVD, plasma CVD, sputtering, or deposition. An insulating film 501b comprising a silicon oxide film at the thickness of 200 nm is formed on the separating layer 501a. The insulating film 501b may be formed by low pressure thermal CVD, plasma CVD, sputtering, or deposition.

Then, an amorphous silicon film 502 at the thickness of 50 nm is formed on the insulating film 501b using a known film forming method. It is to be noted that the film is not limited to an amorphous silicon film, and it may be a semiconductor film (including a microcrystalline semiconductor film) including a non-crystalline structure. Further, the film may be a compound semiconductor film including amorphous structure such as an amorphous silicon germanium film.

The processes from here to the process illustrated in FIG. 4C is completely the same as those disclosed in Japanese Patent Application Laid-open No. Hei 10-247735 applied by the applicant of the present application. Japanese Patent Application Laid-open No. Hei 10-247735 discloses technology with regard to a method of crystallizing a semiconductor film with an element such as Ni being used as the catalyst.

First, a protective film 504 having openings 503a and 503b is formed. In the present embodiment, a silicon oxide film at the thickness of 150 nm is used. Then, a layer 505 containing nickel (Ni) (an Ni containing layer 505) is formed on the protective film 504 by spin coating. Refer to the above laid-open application with regard to the formation of the Ni containing layer 505.

Then, as illustrated in FIG. 4B, heat treatment is performed in an inert atmosphere at 570° C. for 14 hours to crystallize the amorphous silicon film 502. Here, with regions 506a and 506b in contact with Ni (hereinafter referred to as Ni doped regions) being as the starting points, the crystallization proceeds substantially in parallel to the substrate to form a polysilicon film 507 having a crystalline structure with bar-like crystals being aligned.

Next, as illustrated in FIG. 4C, an element which belongs to Family XV (preferably phosphorus) is doped into the Ni doped regions 506a and 506b with the protective film 505 as it is as the mask. In this way, regions 508a and 508b heavily doped with phosphorus (hereinafter referred to as phosphorus doped regions) are formed.

Then, as illustrated in FIG. 4C, heat treatment is performed in an inert atmosphere at 600° C. for 12 hours. This heat treatment makes Ni existing in the polysilicon film 507 move such that, finally, almost all of it is captured in the phosphorus doped regions 508a and 508b as illustrated by arrows. This is thought to be a phenomenon caused by the gettering effect of the metal element (Ni in the present embodiment) by phosphorus.

This process lowers the concentration of Ni remaining in the polysilicon film 509 to at least $2 \times 10^{17}$ atoms/cm$^3$ as a measurement value using SIMS (secondary ion mass spectroscopy). Ni lowered to such an extent has no adverse effect on the TFT characteristics. Further, since this concentration is almost the limit of measurement using SIMS at present, it is thought that the actual value is still lower ($2 \times 10^{17}$ atoms/cm$^3$ or lower).

In this way, the polysilicon film 509 is obtained which is crystallized using catalyst, with the concentration of the catalyst being then lowered to a level at which the operation of the TFTs is not influenced. After that, active layers 510 to 513 formed using only the polysilicon film 509 are formed by patterning. It is to be noted that, here, markers for registering a mask in later patterning are preferably formed using the polysilicon film (FIG. 4D).

Then, a silicon oxynitride film is formed at the thickness of 50 nm by plasma CVD. Then, heat treatment is performed in an oxidizing atmosphere at 950° C. for one hour to perform a thermal oxidation process. It is to be noted that the oxidizing atmosphere may be an oxygen atmosphere or an oxygen atmosphere with a halogen element added thereto.

Figure 5A:
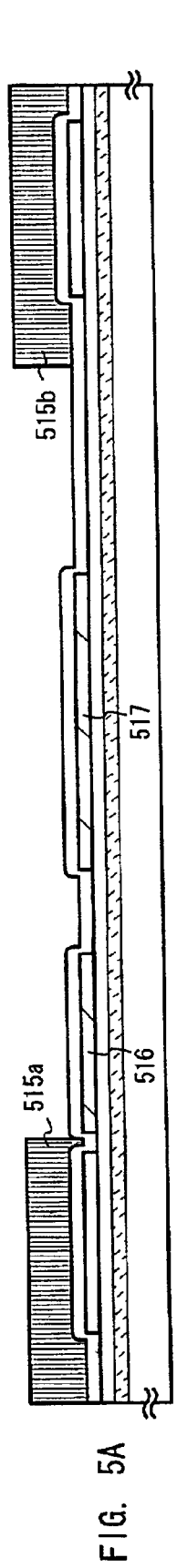
FIGS. 5A–5D illustrate the manufacturing process of the EL display device of Embodiment 1.

In this thermal oxidation process, oxidation proceeds at the interface between the active layers and the silicon oxynitride film. The polysilicon film at the thickness of about 15 nm is oxidized to form a silicon oxide film at the thickness of about 30 nm. Therefore, the silicon oxide film at the thickness of 30 nm and the silicon oxynitride film at the thickness of 50 nm are laminated to form a gate insulating film 514 at the thickness of 80 nm. The thickness of the active layers 510 to 513 becomes 30 nm by the thermal oxidation process. (FIG. 4E) Then, as illustrated in FIG. 5A, resist masks 515a and 515b are formed, and an impurity element for the p type (hereinafter referred to as a p type impurity element) is doped through the gate insulating film 514. As the p type impurity element, representatively an element which belongs to Family XIII, and typically boron or gallium can be used. This process (referred to as a channel doping process) is a process for controlling the threshold voltage of the TFTs.

It is to be noted that, in the present embodiment, boron is doped by ion doping using diborane ($B_2H_6$), plasma excited without mass separation. Of course, ion implantation with mass separation may also be used. By this process, impurity regions 516 to 517 are formed which contain boron at the concentration of $1 \times 10^{15}$ to $1 \times 10^{18}$ atoms/cm$^3$ (representatively $5 \times 10^{16}$ to $5 \times 10^{17}$ atoms/cm$^3$).

Figure 5B:
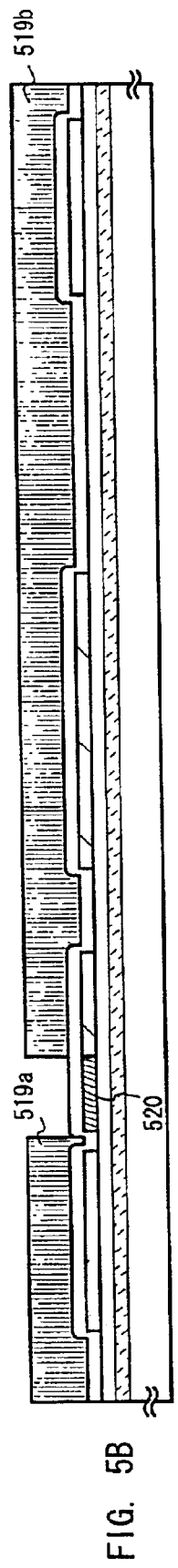

Then, as illustrated in FIG. 5B, resist masks 519a and 519b are formed, and an impurity element for the n type (hereinafter referred to as an n type impurity element) is doped through the gate insulating film 514. As the n type impurity element, representatively an element which belongs to Family XV, and typically phosphorus or arsenic can be used. It is to be noted that, in the present embodiment, phosphorus is doped at the concentration of about $1\times10^{18}$ atoms/cm$^3$ by plasma doping using phosphine (PH$_3$) plasma excited without mass separation. Of course, ion implantation with mass separation may also be used.

The dose is controlled such that the n type impurity element is contained at the concentration of $2\times10^6$ to $5\times10^{19}$ atoms/cm$^3$ (representatively $5\times10^{17}$ to $5\times10^{18}$ atoms/cm$^3$) in an n type impurity region 520 formed by this process.

Figure 5C:
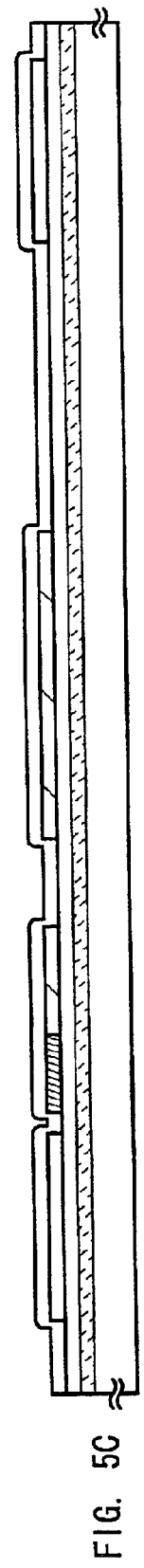
Figure 5D:
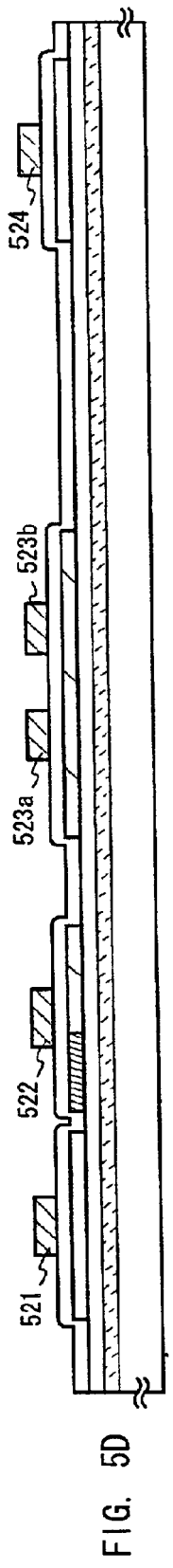

Then, as illustrated in FIG. 5C, the doped n type impurity element and p type impurity element are activated. Though there is no limitation with regard to the activating means, since the gate insulating film 514 is provided, furnace annealing using an electrically heating furnace is preferable. Further, since the process illustrated in FIG. 5A may have damaged the interface between the active layers and the gate insulating film at portions to become the channel forming regions, it is preferable that heat treatment is performed at a temperature as high as possible.

In the present embodiment, since heat-resistant crystallized glass is used, the activation process is performed by furnace annealing at 800° C. for one hour. It is to be noted that thermal oxidation may be performed in an oxidizing atmosphere, or heat treatment may be performed in an inert atmosphere.

This process makes clear the end portions of the n type impurity region 520, that is, the interface portions (joint portions) between the n type impurity region 520 and the regions existing around the n type impurity region 520 and having no n type impurity element doped therein (the p type impurity regions formed in the process illustrated in FIG. 5A). This means that, when the TFTs are completed later, an LDD region and a channel forming region can form a very satisfactory joint portion.

Next, a conductive film at the thickness of 200 to 400 nm is formed and patterned to form gate electrodes 521 to 524. It is to be noted that, though the gate electrodes may be formed of a single layer conductive film, they are preferably formed as laminated films of two layers, three layers, or the like depending on the situation. As the material for the gate electrodes, a known conductive film may be used.

More specifically, a film comprising an element chosen from tantalum (Ta), titanium (Ti), molybdenum (Mo), tungsten (W), chromium (Cr), aluminum (Al), copper (Cu), silver (Ag), or conductive silicon (Si), a nitride thereof (representatively a tantalum nitride film, a tungsten nitride film, or a titanium nitride film), a film comprising an alloy thereof (representatively Mo-W alloy or Mo-Ta alloy), or a silicide thereof (representatively a tungsten silicide film or a titanium silicide film) can be used. Of course, a single layer may be used and laminated layers may be used.

In the present embodiment, laminated films comprising a tungsten nitride (WN) film at the thickness of 50 nm and a tungsten (W) film at the thickness of 350 nm are used, which may be formed by sputtering. By adding inert gas such as Xe or Ne as the sputtering gas, peeling off of the films due to stress may be prevented.

Further, here, the gate electrode 522 is formed so as to overlap a part of the n type impurity region 520 through the gate insulating film 514. The overlapping portion is to become later an LDD region aligned with the gate electrode. It is to be noted that though the gate electrodes 523a and 523b appear to be separate in the sectional view, they are actually electrically connected to each other.

Figure 6A:
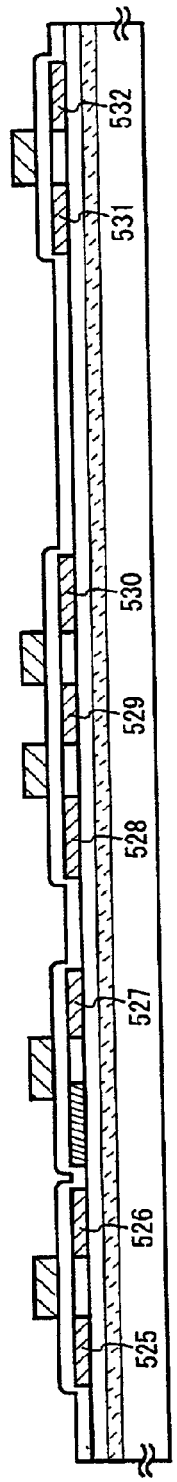
FIGS. 6A–6D illustrate the manufacturing process of the EL display device of Embodiment 1.

Then, as illustrated in FIG. 6A, an n type impurity element (phosphorus in the present embodiment) is doped in a self-aligning manner with the gate electrodes 521 to 524 being as the masks. The dose is controlled such that phosphorus is doped in impurity regions 525 to 532 formed in this way, at the same concentration as that in the n type impurity region 520. More specifically, the concentration of $1\times10^{16}$ to $5\times10^{18}$ atoms/cm$^3$ (typically $3\times10^{17}$ to $3\times10^{18}$ atoms/cm$^3$) is preferable.

Figure 6B:
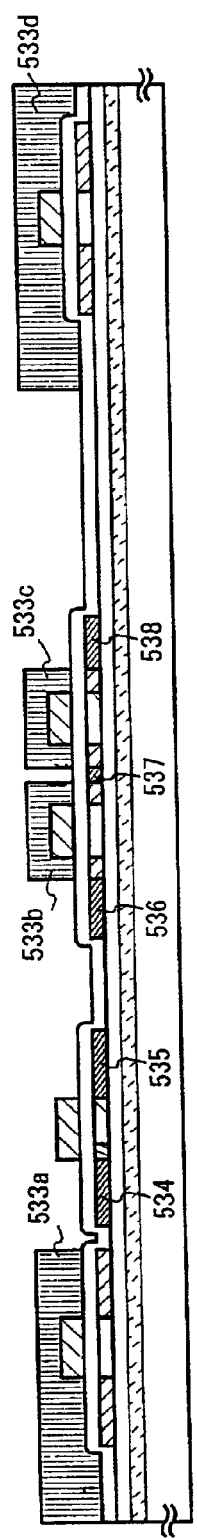

Then, as illustrated in FIG. 6B, resist masks 533a to 533d are formed so as to cover the gate electrodes and the like, and an n type impurity element (phosphorus in the present embodiment) is doped to form impurity regions 534 to 538 with heavily doped phosphorus. Here, also, ion doping using phosphine (PH$_3$) is performed, and the dose is controlled such that the concentration of phosphorus in these regions is $1\times10^{20}$ to $1\times10^{21}$ atoms/cm$^3$ (representatively $2\times10^{20}$ to $5\times10^{21}$ atoms/cm$^3$).

This process forms a source region or a drain region of the n-channel TFT. In case of the TFT for switching, part of the n type impurity regions 528 to 530 formed at the process illustrated in FIG. 6A are left. The left regions correspond to the LDD regions 15a to 15d of the TFT for switching illustrated in FIG. 1.

Figure 6C:
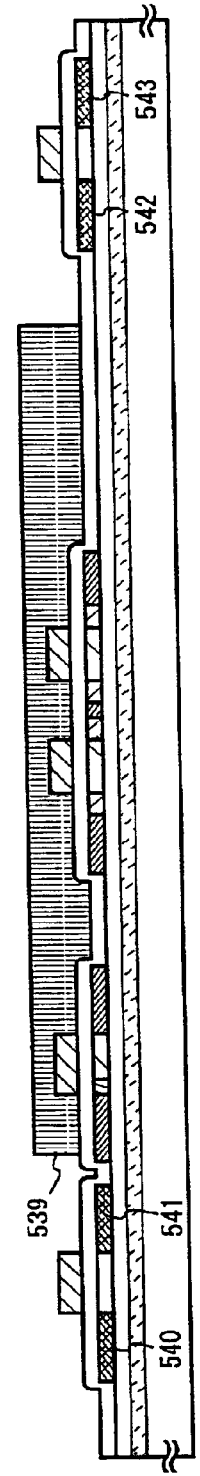

Then, as illustrated in FIG. 6C, the resist masks 533a to 533d are removed and a resist mask 539 is newly formed. Then, a p type impurity element (boron in the present embodiment) is doped to form impurity regions 540 to 543 with heavily doped boron. Here, boron is doped by ion doping using diborane (B$_2$H$_6$) such that the concentration of boron is $3\times10^{20}$ to $3\times10^{21}$ atoms/cm$^3$ (representatively $5\times10^{20}$ to $1\times10^{21}$ atoms/cm$^3$).

It is to be noted that, while phosphorus has already been doped in the impurity regions 540 to 543 at the concentration of $1\times10^{20}$ to $1\times10^{21}$ atoms/cm$^3$, the concentration of boron doped here is at least three times or more than that of phosphorus. Therefore, the n type impurity regions formed in advance are completely inverted to be of a p type, and function as p type impurity regions.

Figure 6D:
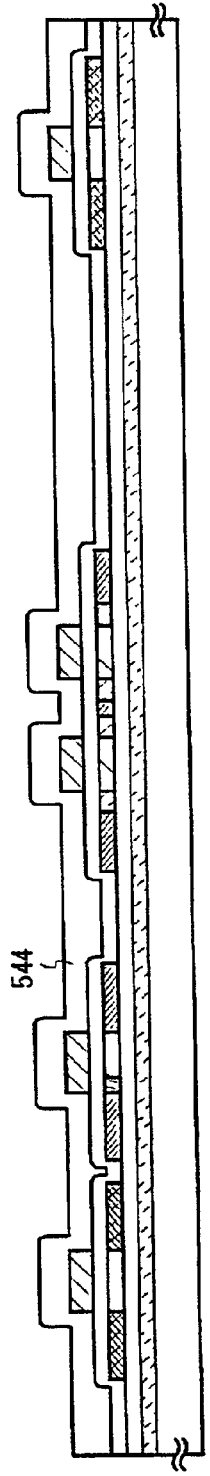

Then, as illustrated in FIG. 6D, after the resist mask 539 is removed, a first interlayer insulating film 544 is formed. As the first interlayer insulating film 544, a single layer insulating film containing silicon or laminated films which are a combination of such layers may be used. The film thickness may be 400 nm to 1.5 µm. In the present embodiment, the first interlayer insulating film 544 is structured to be a silicon oxynitride film at the thickness of 200 nm with a silicon oxide film at the thickness of 800 nm laminated thereon.

After that, the n and p type impurity elements which have been doped at the respective concentrations are activated. As the activating means, furnace annealing is preferable. In the present embodiment, heat treatment using an electrically heating furnace in an nitrogen atmosphere at 550° C. for four hours is performed.

Further, heat treatment in an atmosphere containing 3 to 100% of hydrogen at 300 to 450° C. for 1 to 12 hours is performed to carry out hydrogenation treatment. This process is for terminating unpaired dangling bonds of the semiconductor film with thermally excited hydrogen. As another hydrogenating means, plasma hydrogenation (using plasma excited hydrogen) may also be performed.

It is to be noted that the hydrogenation treatment may be performed during the formation of the first interlayer insulating film 544. That is, the hydrogenation treatment may be performed after the silicon oxynitride film at the thickness of 200 nm is formed, and then the remaining silicon oxide film at the thickness of 800 nm may be formed.

Then, as illustrated in FIG. 7A, contact holes are formed in the first interlayer insulating film 544 to form source wirings 545 to 548 and drain wirings 549 to 551. In addition, to remove the separating layer efficiently, contact holes reaching the the separating layer 501*a* are formed at terminal portions, to form wirings for connection to the source wirings or the drain wirings. Further, the contact holes reaching the separating layer 501*a* are formed by sequentially etching the first interlayer insulating film 544, the gate insulating film 514, and the underlayer film 501*b*. It is to be noted that, in the present embodiment, the electrodes are laminated films having a three-layer structure where a Ti film at the thickness of 100 nm, an aluminum film containing Ti at the thickness of 300 nm, and a Ti film at the thickness of 150 nm are continuously formed by sputtering. Of course, other conductive films may also be used.

Then, a first passivation film 552 at the thickness of 50 to 500 nm (representatively 200 to 300 nm) is formed. In the present embodiment, a silicon oxynitride film at the thickness of 300 nm is used as the first passivation film 552. A silicon nitride film may substituted for the silicon oxynitride film.

Here, it is effective that, prior to the formation of the silicon oxynitride film, plasma treatment is performed using gas containing hydrogen such as $H_2$, $NH_3$ and so on. By supplying hydrogen excited by this pretreatment to the first interlayer insulating film 544 and performing heat treatment, the quality of the first passivation film 552 is improved. At the same time, hydrogen doped in the first interlayer insulating film 544 diffuses to the lower layer side, and thus, the active layers can be hydrogenated effectively.

Then, as illustrated in FIG. 7B, a second interlayer insulating film 553 comprising an organic resin is formed. As the organic resin, polyimide, acrylic, BCB (benzocyclobutene), or the like can be used. In particular, since the second interlayer insulating film 553 is required to planarize the unevenness formed by the TFTs, an acrylic film having excellent planarity is preferable. In the present embodiment, an acrylic film is formed at the thickness of 2.5 $\mu$m.

Then, a contact hole reaching the drain wiring 551 is formed in the second interlayer insulating film 553 and the first passivation film 552 to form a pixel electrode (anode) 554. In the present embodiment, an indium tin oxide (ITO) film is formed at the thickness of 110 nm and is patterned to form the pixel electrode. Alternatively, a transparent conductive film formed by mixing indium oxide with 2 to 20% zinc oxide (ZnO) may be used. The pixel electrode is to become an anode of the EL element.

Then, an insulating film containing silicon (a silicon oxide film in the present embodiment) is formed at the thickness of 500 nm to form a third interlayer insulating film 555, with an opening being formed at a position corresponding to the pixel electrode 554. When the opening is formed, by using wet etching, the side walls can be made to be tapered easily. If the side walls of the opening is not sufficiently gentle, the problem of deterioration of an EL layer due to the unevenness becomes prominent.

Then, an EL layer 556 and a cathode (an MgAg electrode) 557 are continuously formed using vacuum evaporation without releasing to the atmosphere. It is to be noted that the thickness of the EL layer 556 may be 80 to 200 nm (typically 100 to 120 nm), and the thickness of the cathode 557 may be 180 to 300 nm (typically 200 to 250 nm).

In this process, an EL layer and a cathode are formed sequentially with regard to each of pixels corresponding to red, green, and blue. It is to be noted that, since the EL layer is not resistant to solution, it is necessary that an EL layer has to be formed individually with regard to each color without using photolithography. Therefore, it is preferable that a metal mask is used to mask unnecessary portions, and an EL layer and a cathode is selectively formed only in a necessary portion.

That is, first, a mask for masking everything except pixels corresponding to red is set, and using the mask, an EL layer and a cathode for emitting red light are selectively formed. Then, a mask for masking everything except pixels corresponding to green is set, and using the mask, an EL layer and a cathode for emitting green light are selectively formed. Then, similarly a mask for masking everything except pixels corresponding to blue is set, and using the mask an EL layer and a cathode for emitting blue light are selectively formed. It is to be noted that, though it is described here that there are three different masks to be used, the same mask can be used repeatedly. Further, it is preferable that the treatment is performed without breaking the vacuum until the EL layer and the cathode are formed with regard to all the pixels.

It is to be noted that, as the EL layer 556, a known material can be used. Taking drive voltage into consideration, it is preferable that a known material such as an organic material is used. For example, a four-layer structure formed of a hole injection layer, a hole transport layer, a light emission layer, and an electron injection layer may be the El layer. Further, though, in the present embodiment, the MgAg electrode is used as the cathode of an EL element, it may be comprising other known materials.

It is to be noted that, when the green light emission layer is formed, $Alq_3$ (tris-(8-hydroxyquinoline) aluminum complex) is used as the parent material of the light emission layer, with quinacridon or coumarin 6 being added as a dopant. When the red light emission layer is formed, $Alq_3$ is used as the parent material of the light emission layer, with DCJT, DCM1, or DCM2 being added as a dopant. When the blue light emission layer is formed, $BAlq_3$ (complex with five ligands having a mixed ligand complex of 2-methyl-8-quinolinol and phenol derivative) is used as the parent material of the light emission layer, with perylene being added as a dopant.

Of course, the material is not limited to the above organic materials, and known low molecular weight organic EL materials, polymeric organic EL materials, and inorganic EL materials may be used. In case a polymeric organic EL material is used, it may be applied to form the EL layer. Further, as the EL layer, a thin film comprising a light emitting material which emits light (fluorescence) by singlet excitation (a singlet compound), or a thin film comprising a light emitting material which emits light (phosphorescence) by triplet excitation (a triplet compound) can be used.

Further, as a protective electrode 558, a conductive film, the main component of which is aluminum may be used. The protective electrode 558 may be formed by vacuum evaporation using a mask different from the ones used in forming the EL layer and the cathode. Further, it is preferable that the protective electrode 558 is continuously formed after the EL layer and the cathode are formed without releasing to the atmosphere.

Finally, a second passivation film 559 comprising a silicon nitride film is formed at the thickness of 300 nm. Though, actually, the protective electrode 558 plays the role of protecting the EL layer from moisture and the like, by further forming the second passivation film 559, the reliability of the EL elements can be further enhanced.

In this way, an active matrix EL display device structured as illustrated in FIG. 7C is completed on the first substrate

500. It is to be noted that, actually, after the structure illustrated in FIG. 7C is completed, the structure is preferably packaged (encapsulated) using a housing material such as an airtight protective film (a laminate film, an ultraviolet curable resin film, or the like) or a sealing can made of ceramics. At that time, by making the inside of the housing material an inert atmosphere, or by disposing an moisture absorbent (for example, barium oxide) inside the housing material, the reliability (lifetime) of the EL layer is improved.

[Embodiment 2]

In the present example, a process for moving to a plastic substrate the TFTs and the EL elements formed on the first substrate according to Embodiment 1 after the processes in Example 1 is described with reference to FIGS. 8 and 9.

First, according to Embodiment 1, the structure illustrated in FIG. 7C is obtained. It is to be noted that, in the present embodiment, since color filters are used, EL elements provided with an organic EL layer emitting white light are used. More specifically, as the light emission layer, a material disclosed in Japanese Patent Application Laid-open Nos. Hei 8-96959 or Hei 9-63770 may be used. In the present embodiment, as the light emission layer, 1,2-dichloromethane with PVK (polyvinyl carbazole), Bu-PBD (2-(4'-tert-butylphenyl)-5-(4"-biphenyl)-1,3,4-oxadiazole), coumarin 6, DCM1 (4-dicyanomethylene-2-methyl-6-p-dimethylaminostyril-4Hpyran), TPB (tetraphenyl butadiene), and Nile red dissolved therein is used.

Figure 8A:
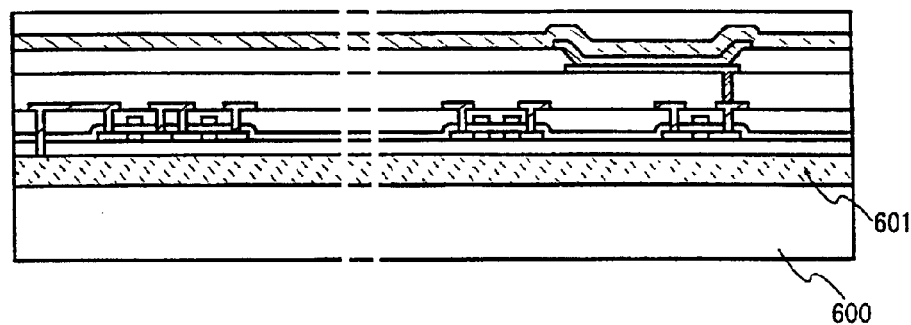
FIGS. 8A–8C illustrate a manufacturing process of an EL display device of Embodiment 2.

It is to be noted that FIG. 8A corresponds to FIG. 7C. The first substrate 500 and the separating layer 501a in FIG. 7C correspond to a first substrate 600 and a separating layer 601, respectively. It is to be noted that FIG. 8A also shows a terminal portion which is not illustrated with regard to Embodiment 1. Wiring in the terminal portion which is connected to the source wirings or the drain wirings is formed so as to be in contact with the separating layer 601.

Figure 8B:
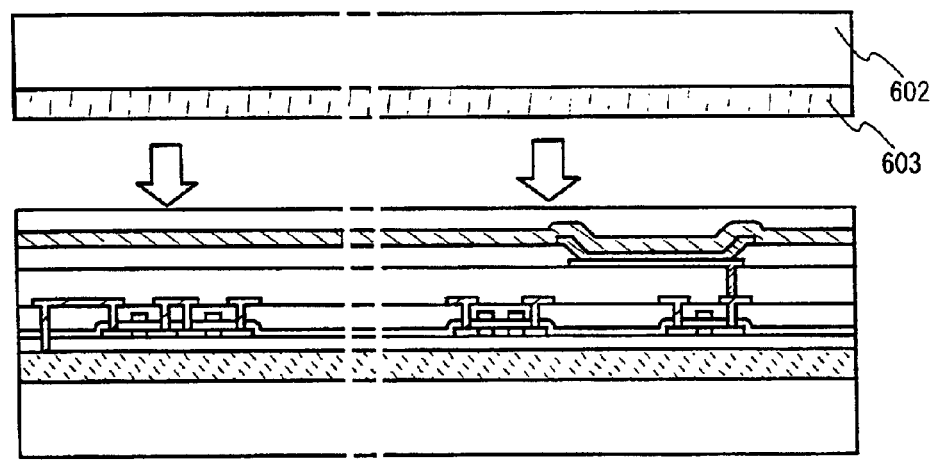

Then, as illustrated in FIG. 8B, a substrate (hereinafter referred to as a fixing substrate) 602 for fixing the elements is attached using a first adhesive layer 603. Though, in the present embodiment, a flexible plastic film is used as the fixing substrate 602, a glass substrate, a quartz substrate, a plastic substrate, a silicon substrate, or a ceramic substrate may also be used. Further, it is necessary that a material which has a satisfactory selection ratio when the separating layer 601 is removed later is used as the first adhesive layer 603.

Representatively, an insulating film comprising resin can be used as the first adhesive layer 603. Though polyimide is used in the present embodiment, acrylic, polyamide, or epoxy resin may also be used. It is to be noted that, when the first adhesive layer 603 is on the side of an observer (on the side of a user of the electric device) seen from the EL elements, the first adhesive layer 603 is required to be comprising a light transmitting material.

The process illustrated in FIG. 8B can, similarly to a packaging process, completely shut out the EL elements from the atmosphere, which can almost completely suppress deterioration of the organic EL material due to oxidation, and thus, can greatly improve the reliability of the EL elements.

Figure 8C:
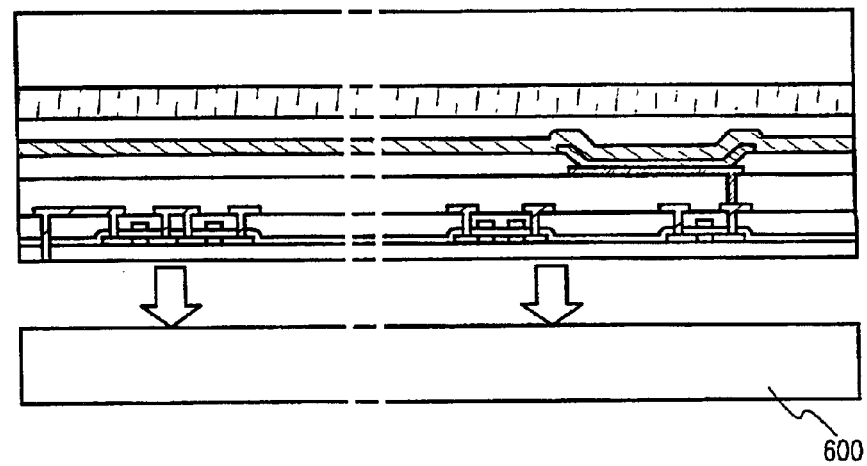

Then, as illustrated in FIG. 8C, the whole of the first substrate 600 with the EL elements formed thereon is exposed to gas containing halogen fluoride to remove the separating layer 601. In the present embodiment, chlorine trifluoride ($ClF_3$) is used as such halogen fluoride, and nitrogen is used as the diluting gas. As the diluting gas, argon, helium, or neon may also be used. With regard to both chlorine trifluoride and nitrogen, the flow rate may be 500 sccm ($8.35 \times 10^{-6}$ m$^3$/s) and the reaction pressure may be 1 to 10 Torr ($1.3 \times 10^2$ to $1.3 \times 10^3$ Pa). The processing temperature may be room temperature (typically 20 to 27° C.).

In this case, the silicon film is etched while the plastic film, the glass substrate, the polyimide film, and the silicon oxide film are not etched. In other words, by the exposure to the chlorine trifluoride gas, the separating layer 601 is selectively etched, to be finally completely removed. It is to be noted that, though the active layers are also comprising a silicon film, since they are covered with the gate insulating film, they are not exposed to the chlorine trifluoride gas, and therefore, they are not etched.

In the present embodiment, the separating layer 601 is gradually etched from the exposed end portions, and when it is completely removed, the first substrate 600 is separated from the underlayer film. Here, the TFTs and the EL elements formed by laminating the thin films remain and are moved to the fixing substrate 602.

Here, the separating layer 601 is etched from the end portions. It is to be noted that, as the first substrate 600 becomes larger, time taken until the separating layer 601 is completely removed becomes longer, which is not preferable. Therefore, it is desirable that the diagonal size of the first substrate 600 is 3 inches or smaller (preferably 1 inch or smaller).

Figure 9A:
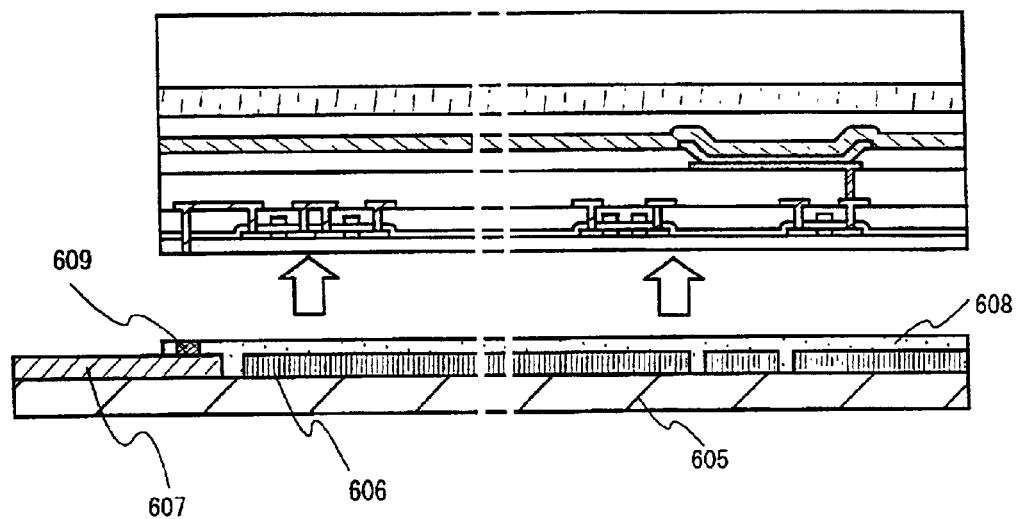
FIGS. 9A–9B illustrate the manufacturing process of the EL display device of Embodiment 2.

After the TFTs and the EL elements are moved to the fixing substrate 602 in this way, as illustrated in FIG. 9A, a second adhesive layer 608 is formed to attach the fixing substrate 602 to a second substrate 605 as a plastic substrate. It is to be noted that, in the second substrate 605, color filters 606 corresponding to the respective pixels and TFTs are provided in the pixel portion, and a terminal connecting portion 607 is provided in the terminal portion and conductive anisotropic adhesive 609 containing conductive filler is provided over the terminal connecting portion so as to be in contact with the exposed wiring.

Here, since the respective color filters 606 can be formed using a combination of spin coating and photolithography or by printing, the color filters 606 can be formed on the plastic film without a problem. As the color filters, acrylic resin films containing pigment (manufactured by Fuji Film Olin) at the thickness of 1 to 2 $\mu$m are used. Compared with a case where the color filters are formed on the element forming substrate, the yield is expected to be improved.

Further, as the second adhesive layer 608, an insulating film comprising resin (representatively, polyimide, acrylic, polyamide, or epoxy resin) may be used, or an inorganic insulating film (representatively a silicon oxide film) may be used.

Figure 9B:
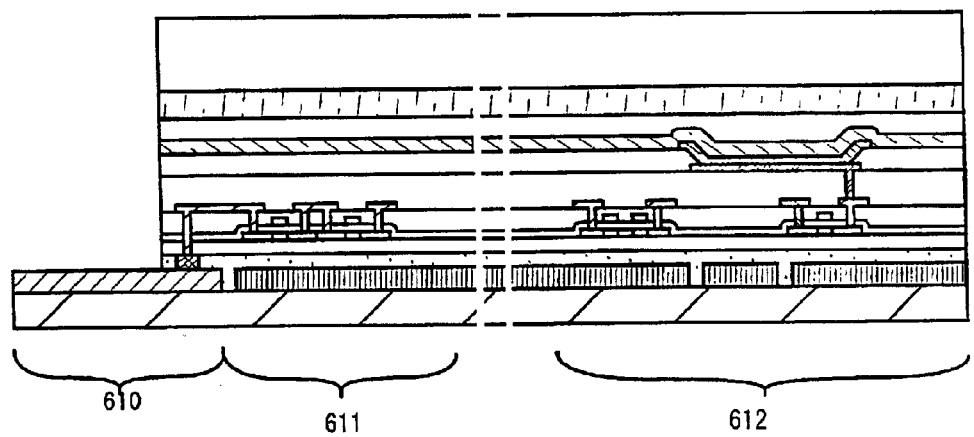

In this way, the TFTs and the EL elements are moved from the first substrate 600 to the second substrate 605. As a result, as illustrated in FIG. 9B, a flexible EL display device having a pixel portion 612, a driver circuit portion 611, and a terminal portion 610 provided on the second substrate 605 can be obtained.

Further, if the fixing substrate 600 and the second substrate 605 comprise the same material (a plastic film), since the coefficient of thermal expansion is the same, the influence of stress distortion due to temperature change is less liable to occur.

[Embodiment 3]

In the present embodiment, a terminal portion differently structured from the terminal portion described in Embodiment 2 is described with reference to FIG. 10A.

Figure 10A:
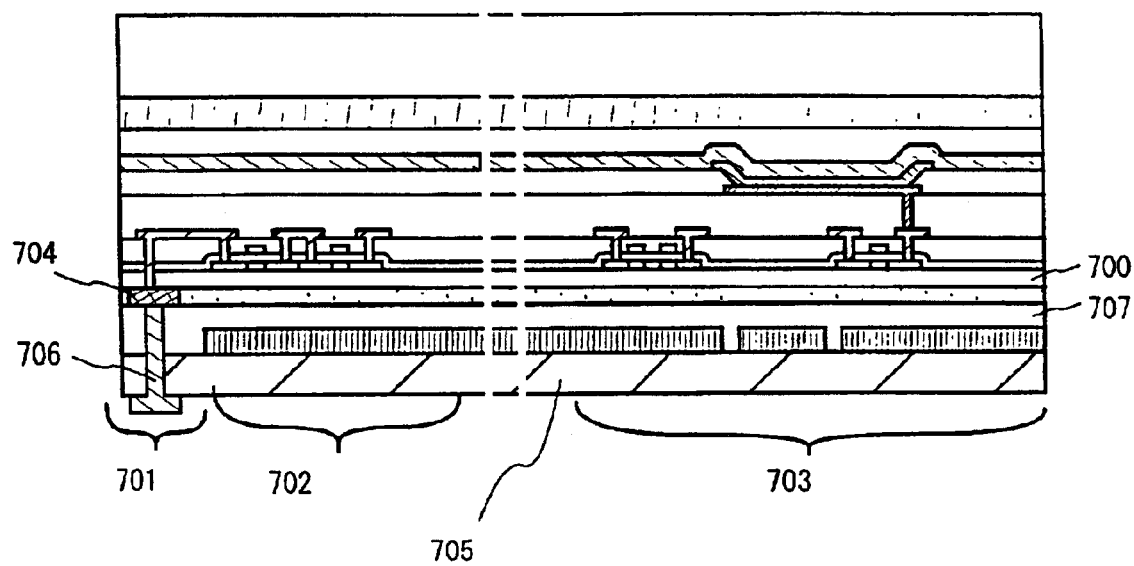
FIGS. 10A–10B illustrate a terminal portion of an EL display device according to the present invention.

In FIG. 10A, the structure of the TFTs and the EL elements is the same, and thus, the description thereof is omitted here.

A method of manufacturing the terminal portion illustrated in FIG. 10A is described in the following. First, color filters are formed on the second substrate similarly to the case of Embodiment 2. Then, a protective film 707 covering the color filters is formed. Then, a first electrode 704 is formed at a position aligned with wiring exposed on the protective film. Then, the second substrate in this state is attached to an underlayer film 700 using an adhesive layer. Then, the second substrate 705 and the protective film 707 are sequentially etched to form a contact hole reaching the electrode 704. Then, a second electrode 706 is formed. In this way, a terminal portion 701 illustrated in FIG. 10A is formed.

Figure 10B:
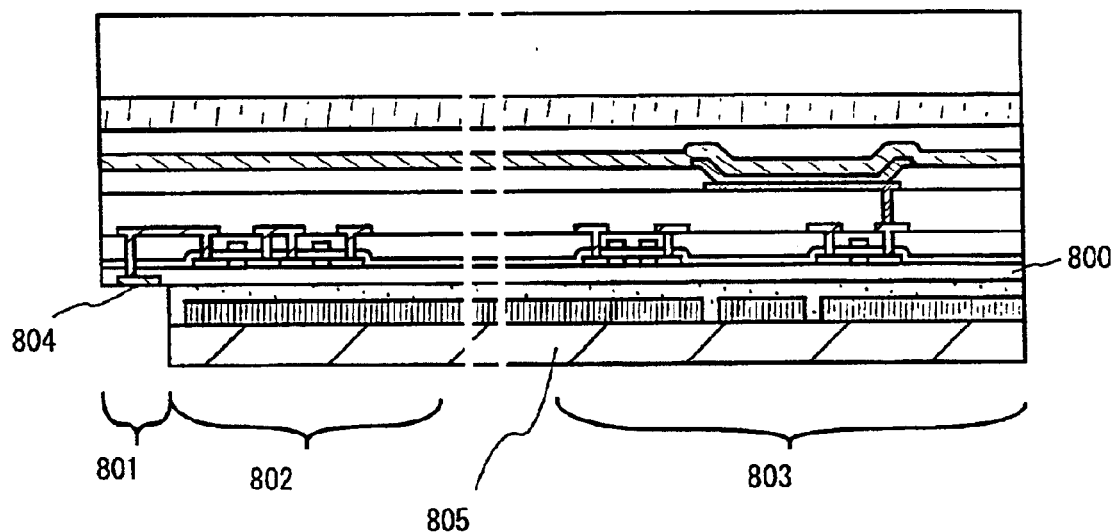

FIG. 10B illustrates another terminal portion structured differently.

In FIG. 10B, when a pixel portion 803 and a driver circuit portion 802 are formed, an electrode 804 is formed before an underlayer film 800 is formed. Then, by shifting the end portion of the second substrate 805 with respect to the end portion of the fixing substrate to which the second substrate 805 is attached, the electrode 804 is made to be in an exposed state. In this way, a terminal portion 801 is formed.

The present embodiment can be freely combined with Embodiment 1 or Embodiment 2.

[Embodiment 4]

According to Embodiment 1 and Embodiment 2, the airtightness is enhanced by a process such as packaging. Then, a connector (a flexible printed circuit: FPC) is attached which connects an element formed on the second substrate (plastic substrate) or the terminal connecting portion 607 (FIG. 9A) drawn from the circuit with an external signal terminal to complete the product. Such an EL display device which can now be shipped is herein referred to as an EL module.

Figure 11:
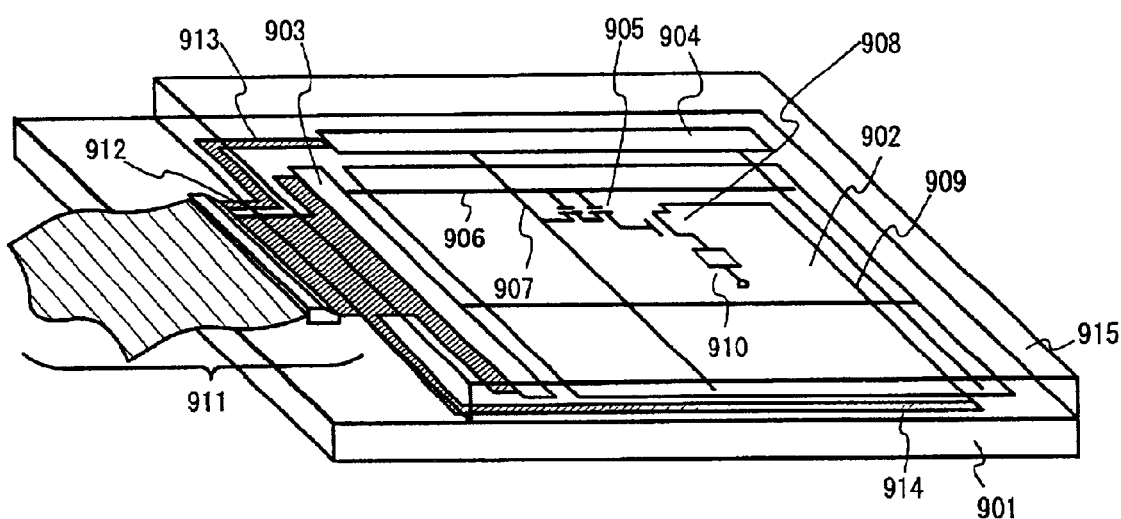
FIG. 11 illustrates the outward appearance of an EL display device according to the present invention.

In the present embodiment, the structure of an active matrix EL display device is described with reference to the perspective view of FIG. 11. The active matrix EL display device according to the present embodiment having a pixel portion 902, a gate side driver circuit 903, and a source side driver circuit 904 all formed on a plastic substrate 901. A switching TFT 905 in the pixel portion is an n-channel TFT, and is disposed at an intersection of a gate wiring 906 connected to the gate side driver circuit 903 and a source wiring 907 connected to the source side driver circuit 904. A drain of the switching TFT 905 is connected to a gate of a current control TFT 908.

Further, a source side of the current control TFT 908 is connected to a power source supply line 909. In a structure as the present embodiment, an EL drive power source line 909 is given the ground potential (earth potential). A drain of the TFT 908 for controlling current is connected to an EL element 910. Predetermined voltage (10 to 12 V in the present embodiment) is applied to a cathode of the EL element 910.

An FPC 911 to be an external input/output terminal is provided with input/output wirings (connection wirings) 912 and 913 for sending a signal to the driver circuits, and an input/output wiring 914 connected to the EL drive power source line 909. Here, the packaging is performed using a fixing substrate 915.

The present embodiment can be freely combined with any one of Embodiments 1 to 3.

[Embodiment 5]

The present embodiment according to the present invention is described with reference to FIGS. 16 to 18. Here, a method of simultaneously forming a pixel TFT and a storage capacitor in the pixel portion, and a TFT for a driver circuit provided on the periphery of the pixel portion is described in detail along the processes.

In FIG. 16A, as a substrate 101, barium borosilicate glass or aluminoborosilicate glass represented by Corning #7059 glass and #1737 glass, a quartz substrate, or the like is used.

Then, a separating layer 100 for separating the substrate 101 in a later process is formed on the surface of the substrate 101 where TFTs are to be formed. The separating layer 100 comprising an amorphous silicon film is formed at the thickness of 100 to 500 nm (300 nm in the present embodiment). The separating layer 100 may be formed by low pressure thermal CVD, plasma CVD, sputtering, or deposition. An underlayer film 102 comprising an insulating film such as a silicon oxide film, a silicon nitride film, a silicon oxynitride film, or the like is formed on the separating layer 100 for the purpose of preventing diffusion of impurity from the substrate 101. For example, a silicon oxynitride film 102a is formed from $SiH_4$, $NH_3$, and $N_2O$ using plasma CVD at the thickness of 10 to 200 nm (preferably 50 to 100 nm), and then a silicon oxynitride hydride film 102b formed similarly from $SiH_4$ and $N_2O$ at the thickness of 50 to 200 nm (preferably 100 to 150 nm) is laminated. Though the underlayer film 102 is described here as structured to have two layers, the underlayer film 102 may have a single layer or lamination of two or more layers of the above insulating film.

Then, a semiconductor layer 103a having non-crystalline structure is formed at the thickness of 25 to 80 nm (preferably 30 to 60 nm) by a method such as plasma CVD or sputtering. Such a semiconductor film having a non-crystalline structure includes an amorphous semiconductor layer and amicrocrystalline semiconductor film. A compound semiconductor film including amorphous structure such as an amorphous silicon germanium film may also be used. In case an amorphous silicon film is formed by plasma CVD, it is possible to continuously form the underlayer film 102 and the amorphous semiconductor layer 103a.

Then, crystallization process is performed to form a crystalline semiconductor layer 103b from the non-crystalline semiconductor layer 103a. The method for performing this may be laser annealing, thermal annealing (solid deposition), or rapid thermal annealing (RTA). In this crystallization process, it is preferable that, first, hydrogen contained in the amorphous semiconductor layer is discharged. By first performing heat treatment at 400 to 500° C. for about one hour to make the amount of hydrogen contained 5 atom % or less and then performing the crystallization, roughness of the surface of the film can be prevented, which is preferable.

When the crystallization is performed by laser annealing, the light source may be a pulse oscillating type or a continuous light emission type excimer laser or an argon laser. In case a pulse oscillating type excimer laser is used, a laser beam is processed to be linear to perform laser annealing. The conditions of the laser annealing are appropriately selected by the user. For example, the laser pulse oscillation frequency may be 30 Hz and the laser energy density may be 100 to 500 $mJ/cm^2$ (representatively 300 to 400 $mJ/cm^2$). The linear beam is irradiated over the whole surface of the substrate, with the overlap ratio of the linear beam being 80 to 98% at this time. In this way, a crystalline semiconductor layer 103b as illustrated in FIG. 16B can be obtained.

Then, a resist pattern is formed on the crystalline semiconductor layer 103b using photolithography with a first photomask (PM1) being as the mask, the crystalline semiconductor layer is divided into island-like portions by dry etching, and as illustrated in FIG. 16C, island-like semiconductor layers 104 to 108 are formed. Mixed gas of $CF_4$ and $O_2$ is used in the dry etching of the crystalline silicon film.

After that, a mask layer comprises a silicon oxide film at the thickness of 50 to 200 nm by plasma CVD or sputtering. In the present example, a silicon oxide film at the thickness of 130 mn is formed.

Then, a gate insulating film 109 is formed. The gate insulating film 109 comprises an insulating film containing silicon at the thickness of 40 to 150 nm by plasma CVD or sputtering. In the present embodiment, the gate insulating film 109 comprises a silicon oxynitride film at the thickness of 120 nm. A silicon oxynitride film formed by adding $O_2$ to $SiH_4$ and $N_2O$ is a preferable material for this use since the fixed charge density in the film is decreased. A slicon oxynitride film formed from $SiH_4$, $N_2O$, and $H_2$ is also preferable since the interface defect density can be decreased. Of course, the gate insulating film is not limited to such a silicon oxynitride film, and a single layer or lamination of layers of other insulating films containing silicon may also be used.

Then, as illustrated in FIG. 16D, a heat resistant conductive layer 111 for forming gate electrodes is formed on the gate insulating film 109 having a first shape at the thickness of 200 to 400 nm (preferably 250 to 350 nm). The heat resistant conductive layer may be formed of a single layer, or depending on the situation, may be of a laminated structure formed of a plurality of layers such as two or three layers. The heat resistant conductive layer as used herein includes a film comprising an element selected from Ta, Ti, and W, an alloy containing such an element as a component, or an alloy which is a combination of such elements. In the present embodiment, a W film is formed at the thickness of 300 nm. The W film may be formed by sputtering with W being as the target, or may be formed by thermal CVD using tungsten hexafluoride ($WF_6$).

Then, resist masks 112 to 117 are formed by photolithography using a second photomask (PM2), and a first etching treatment is performed. In the present embodiment, the etching is performed by an ICP etching system, using $Cl_2$ and $CF_4$ as the etching gas, and forming plasma by applying RF electric power of 3.2 W/cm$^2$ (13.56 MHz) at the pressure of 1 Pa. RF electric power of 224 mW/cm$^2$ (13.56 MHz) is applied to the side of the substrate (a sample stage). Therefore, substantially negative self-bias voltage is applied. Under these conditions, the etching rate of the W film is about 100 nm/min. With regard to the first etching process, the time just necessary for completely etching the W film is estimated based on this etching rate, and the practical etching time is set so as to be 120% of the estimated necessary time.

By the first etching treatment, conductive layers 118 to 123 having a first tapered shape are formed. As illustrated in FIG. 17A, the angle of the formed tapered portions is 15 to 30°. In order to perform the etching without leaving the residue, overetching is performed by increasing the etching time by about 10 to 20%. Since the selection ratio of an silicon oxynitride film (the gate insulating film 109 having the first shape) to a W film is 2 to 4 (representatively 3), the overetching treatment etches about 20 to 50 nm of the surface where the silicon oxynitride film is exposed to form a gate insulating film 134 having a second shape which has tapered shapes in proximity to end portions of the conductive layers having the first tapered shape.

Then, first doping treatment is performed to dope an impurity element of one conductive type into the island-like semiconductor layers. Here, a process of doping an impurity element for the n type is performed. With the masks 112 to 117 for forming the conductive layers having the first tapered shape being left as they are, the impurity element for the n type is doped in a self-aligning manner by ion doping, with the conductive layers 118 to 123 having the first tapered shape being as the mask. In order to dope the impurity element for the n type so that it goes through the tapered portions at the end portions of the gate electrodes and the gate insulating film to reach the semiconductor layers thereunder, the dose is $1\times10^{13}$ to $5\times10^{14}$ atoms/cm$^3$ and the acceleration voltage is 80 to 160 keV. As the impurity element for the n type, an element which belongs to Family XV, typically phosphorus (P) or arsenic (As), is used. Here, phosphorus (P) is used. By such ion doping, the impurity element for the n type is doped in the first impurity regions 124, 126, 128, 130, and 132 at the concentration of $1\times10^{20}$ to $1\times10^{21}$ atoms/cm$^3$. With regard to second impurity regions (A) formed below the tapered portions, the impurity element for the n type is doped therein at the concentration of $1\times10^{17}$ to $1\times10^{20}$ atoms/cm$^3$, though the concentration is not even over the regions.

In this process, the change in the concentration of the impurity element for the n type contained in the second impurity regions (A) 125, 127, 129, 131, and 133 at positions overlapping at least the conductive layers 125, 127, 129, 131, and 133 having the first tapered shape reflects the change in the film thickness of the tapered portions. That is, the concentration of phosphorus (P) doped in the second impurity regions (A) 129 to 132 gradually decreases from the end portions of the conductive layers toward the inside in the region overlapping the conductive layers of the first tapered shape. This is because the concentration of phosphorus (P) reaching the semiconductor layers change due to the difference in the film thickness of the tapered portions.

Then, as illustrated in FIG. 17B, second etching treatment is performed. This etching treatment is also performed by an ICP etching system, using mixed gas of $Cl_2$ and $CF_4$ as the etching gas, with the RF electric power being 3.2 W/cm$^2$ (13.56 MHZ), the bias electric power being 45 mW/cm$^2$ (13.56 MHz), and the pressure being 1.0 Pa. Under these conditions, conductive layers 140 to 145 having a second tapered shape are formed. Tapered portions are formed at the end portions of the conductive layers 140 to 145, and the shape of the tapered portions is such that the thickness gradually increases from the end portions toward the inside. Compared with the case of the first etching treatment, the bias electric power to be applied to the substrate side is lower, and thus the ratio of isotropic etching becomes large accordingly, resulting in the angle of the tapered portions of 30 to 60°. Further, the surface of the gate insulating film 134 having a second shape is etched by about 40 nm to newly form a gate insulating film 170 of a third shape.

Then, an impurity element for the n type is doped with the dose being lowered and the acceleration voltage being raised compared with the case of the first doping treatment. For example, the doping is performed with the acceleration voltage of 70 to 120 keV and the dose of $1\times10^{13}$ atoms/cm$^3$ such that the concentration of the impurity in the regions overlapping the conductive layers 140 to 145 having the second shape is $1\times10^{16}$ to $1\times10^{18}$ atoms/cm$^3$. In this way, second impurity regions (B) 146 to 149 are formed.

Then, impurity regions 156a to 156c and 157a to 157c of the opposite conductive type to the one conductive type are formed in the island-like semiconductor layers 104 and 106 forming the p-channel TFTs, respectively. In this case also, with the conductive layers 140 and 142 having the second tapered shape being as the mask, an impurity element for the p type is doped to form impurity regions in a self-aligning manner. Here, the whole of the island-like semiconductor layers 105, 107, and 108 forming the n-channel TFTs are covered by forming resist masks 151-153 using a third photomask (PM3). The impurity regions 156 and 157 formed here are formed by ion doping using diborane ($B_2H_6$) such that the concentration of the impurity element for the p type in the impurity regions 156 and 157 is $2\times10^{20}$ to $2\times10^{21}$ atoms/cm$^3$.

However, the impurity regions 156 and 157 in detail can be divided into three regions containing the impurity element for the n type. Third impurity regions 156a and 157a contain the impurity element for the n type at the concentration of $1\times10^{20}$ to $1\times10^{21}$ atoms/cm$^3$, fourth impurity regions (A) 156b and 157b contain the impurity element for the n type at the concentration of $1\times10^{17}$ to $1\times10^{20}$ atoms/cm$^3$, and fourth impurity regions (B) 156c and 157c contain the impurity element for the n type at the concentration of $1\times10^{16}$ to $5\times10^{18}$ atoms/cm$^3$. However, by making the concentration of the impurity element for the p type in the impurity regions 156b, 156c, 157b, and 157c to be $1\times10^{19}$ atoms/cm$^3$ or higher, and by making the concentration of the impurity element for the p type in the third impurity regions 156a and 157a to be 1.5 to 3 times as high do not cause any trouble in that the third impurity regions function as a source region or a drain region of the p-channel TFTs. Further, part of the fourth impurity regions (B) 156c and 157c are formed to overlap the conductive layers 140 and 142 having the second tapered shape, respectively.

After that, as illustrated in FIG. 18A, a first interlayer insulating film 158 is formed over the gate electrodes and the gate insulating film. The first interlayer insulating film may comprise a silicon oxide film, a silicon oxynitride film, a silicon nitride film, or laminated films as a combination thereof. In any case, the first interlayer insulating film 158 comprises an inorganic insulating material. The thickness of the first interlayer insulating film 158 is 100 to 200 nm.

Then, a process for activating the doped impurity elements for the n type and the p type at the respective concentrations is performed. This process is performed by thermal annealing using a furnace for furnace annealing. Alternatively, laser annealing or rapid thermal annealing (RTA) may also be used. Thermal annealing is performed in an nitrogen atmosphere with the concentration of oxygen being 1 ppm or lower, preferably 0.1 ppm or lower at 400 to 700° C., representatively 500 to 600° C. In the present embodiment, heat treatment at 550° C. for four hours is performed.

Following the activation process, the atmospheric gas is changed, and heat treatment in an atmosphere containing 3 to 100% of hydrogen at 300 to 450° C. for 1 to 12 hours is performed to carry out a process of hydrogenating the island-like semiconductor layers. As another hydrogenating means, plasma hydrogenation (using plasma excited hydrogen) may also be performed.

Then, a second interlayer insulating film comprises an organic insulating material. By forming the second interlayer insulating film of an organic insulating material in this way, the surface can be planarized satisfactorily. Further, since an organic resin material generally has a low permittivity, the parasitic capacitance can be lowered. Since an organic resin material also has hygroscopicity and thus is not suitable as a protective film, it is preferable that, as in the present embodiment, an organic resin material is used in combination with a silicon oxide film, a silicon oxynitride film, a silicon nitride film, or the like formed as the first interlayer insulating film 158.

After that, a resist mask in a predetermined pattern is formed using a fourth photomask (PM4) to form contact holes formed in the respective island-like semiconductor layers and reaching the impurity regions that are the source regions or the drain regions.

Then, a conductive metal film is formed by sputtering or vacuum evaporation, a resist mask pattern is formed using a fifth photomask (PM5), and etching is performed to form source lines 160 to 164 and drain lines 165 to 168.

Then, a transparent conductive film is formed at the thickness of 80 to 120 nm, and by patterning using a sixth photomask (PM6), a pixel electrode (shown as 180 in FIG. 18B) is formed. As the transparent conductive film, both indium oxide/zinc oxide alloy ($In_2O_3$—ZnO) and zinc oxide (ZnO) are suitable materials. Further, zinc oxide with gallium doped therein for the purpose of enhancing the transmittance of visible light and conductivity (ZnO:Ga) or the like can be suitably used.

In this way, using the six photomasks, a substrate having thereon both TFTs of the driver circuit and a pixel TFT of the pixel portion can be completed. A first p-channel TFT 1100, a first n-channel TFT 1101, a second p-channel TFT 1102, and a second n-channel TFT 1103 are formed in the driver circuit while a pixel TFT 1104 and a storage capacitor 1105 are formed in the pixel portion. For convenience' sake, such a substrate is herein referred to as an active matrix substrate.

In the first p-channel TFT 1100 in the driver circuit, the conductive layer having the second tapered shape functions as a gate electrode 220. The island-like semiconductor layer 104 is structured to have a channel forming region 206, a third impurity region 207a which functions either as a source region or as a drain region, a fourth impurity region (A) 207b forming an LDD region which does not overlap the gate electrode 220, and a fourth impurity region (B) 207c forming an LDD region a part of which overlaps the gate electrode 220.

In the first n-channel TFT 1101, the conductive layer having the second tapered shape functions as a gate electrode 221. The island-like semiconductor layer 105 is structured to have a channel forming region 208, a first impurity region 209a which functions either as a source region or as a drain region, a second impurity region (A) 209b forming an LDD region which does not overlap the gate electrode 221, and a second impurity region (B) 209c forming an LDD region a part of which overlaps the gate electrode 221. While the channel length is 2 to 7 μm, the length of the overlapping portion of the second impurity region (B) 209c and the gate electrode 221 is 0.1 to 0.3 μm. This length $L_{OV}$ is controlled by the thickness of the gate electrode 221 and the angle of the tapered portion. By forming such an LDD region in the n-channel TFT, the high electric field generated in proximity to the drain region can be alleviated, hot carriers are prevented from being generated, and the TFT can be prevented from deteriorating.

In the second p-channel TFT 1102 in the driver circuit, similarly, the conductive layer having the second tapered shape functions as a gate electrode 222.

The island-like semiconductor layer 106 is structured to have a channel forming region 210, a third impurity region 211a which functions either as a source region or as a drain region, a fourth impurity region (A) 211b forming an LDD region which does not overlap the gate electrode 222, and a fourth impurity region (B) 211c forming an LDD region a part of which overlaps the gate electrode 222.

In the second n-channel TFT 1103 in the driver circuit, the conductive layer having the second tapered shape functions as a gate electrode 223. The island-like semiconductor layer 107 is structured to have a channel forming region 212, a first impurity region 213a which functions either as a source region or as a drain region, a second impurity region (A) 213b forming an LDD region which does not overlap the gate electrode 223, and a second impurity region (B) 213c forming an LDD region part of which overlaps the gate electrode 223. Similarly to the case of the second n-channel TFT 201, the length of the overlapping portion of the second impurity region (B) 213c and the gate electrode 223 is 0.1 to 0.3 µm.

[Embodiment 6]

In the present embodiment, a method of manufacturing a liquid crystal display device from the active matrix substrate obtained according to Embodiment 5 is described.

After the state illustrated in FIG. 18B is obtained according to Embodiment 5, an oriented film is formed and is attached to the fixing substrate using a sealant. It is to be noted that a fixing substrate 1001 which transmits light has an opposing electrode 1002 and an oriented film 1003 formed thereon. Further, though not shown in the figure, the distance between the substrates is kept by spacers and filler contained in the sealant. Further, liquid crystal 1004 is filled between the substrates. (FIG. 12) Then, as described in Embodiment 2, the whole substrate is exposed to gas containing halogen fluoride to remove the separating layer 100. In the present embodiment, chlorine trifluoride ($ClF_3$) is used as such halogen fluoride, and nitrogen is used as the diluting gas. With regard to both chlorine trifluoride and nitrogen, the flow rate may be 500 sccm ($8.35 \times 10^{-6}$ m$^3$/s) and the reaction pressure may be 1 to 10 Torr ($1.3 \times 10^2$ to $1.3 \times 10^3$ Pa). The processing temperature may be room temperature (typically 20 to 27° C.).

In this case, the silicon film is etched while the plastic film, the glass substrate, the polyimide film, and the silicon oxide film are not etched. In other words, by the exposure to the chlorine trifluoride gas, the separating layer 100 is selectively etched, to be finally completely removed.

In the present embodiment, the separating layer 100 is gradually etched from the exposed end portions, and when it is completely removed, the first substrate 101 is separated from the underlayer film 102.

Figure 13:
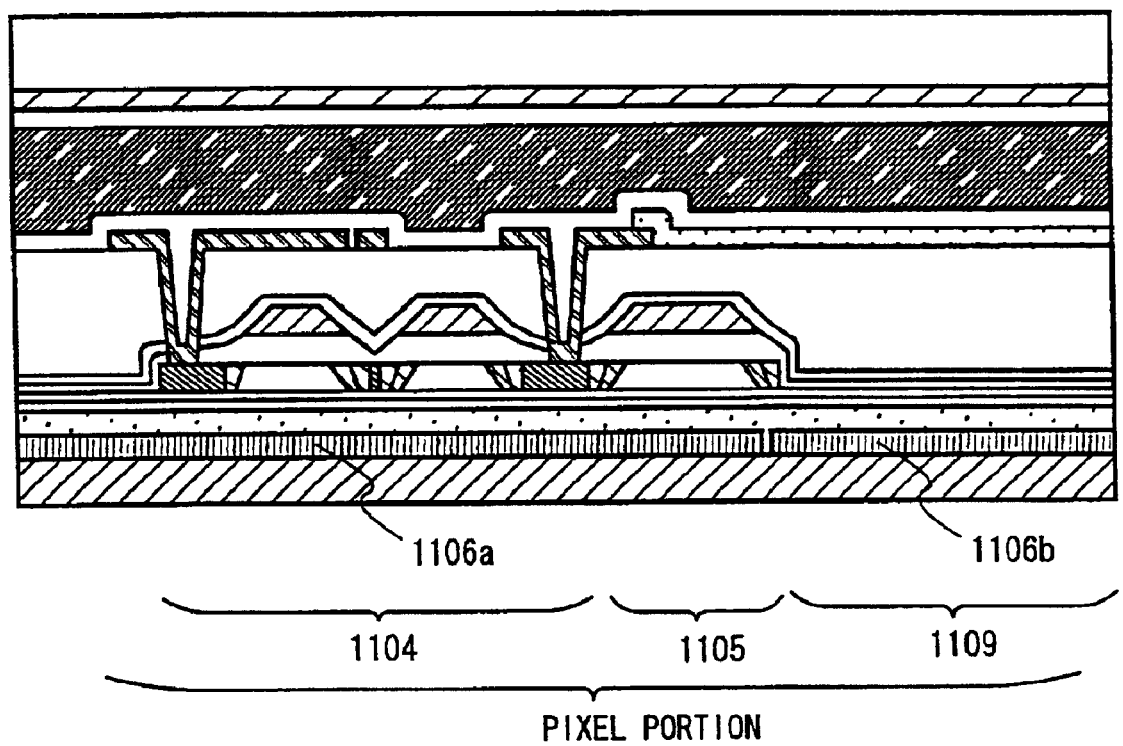
FIG. 13 is a structural view in section of the pixel portion of the liquid crystal display device.

Then, the underlayer 102 is attached to a second substrate (plastic substrate) 1108 using an adhesive layer 1107 (FIG. 12). In the pixel portion on the second substrate (plastic substrate) 1108, R, G, and B color filters 1106 are arranged with regard to each pixel electrode. Further, for the purpose of shielding from light, a red color filter is arranged so as to be aligned with the respective TFTs. It is to be noted that the pixel portion illustrated in FIG. 12 is of a red (R) pixel. FIG. 13 illustrates an exemplary structural view in section of the pixel portion in case of a green (G) or blue (B) pixel. A red color filter 1106a is aligned with the TFTs and a green (G) or blue (B) color filter 1106b is aligned with an opening 1109.

Though a terminal portion is not illustrated in FIGS. 12, 13, and 16 to 18, a terminal portion may be, similarly to the structure of the terminal portions described in Embodiment 2 and Embodiment 3, formed by forming a contact hole reaching the separating layer and forming an electrode connected to a desired wiring.

[Embodiment 7]

Figure 14A:
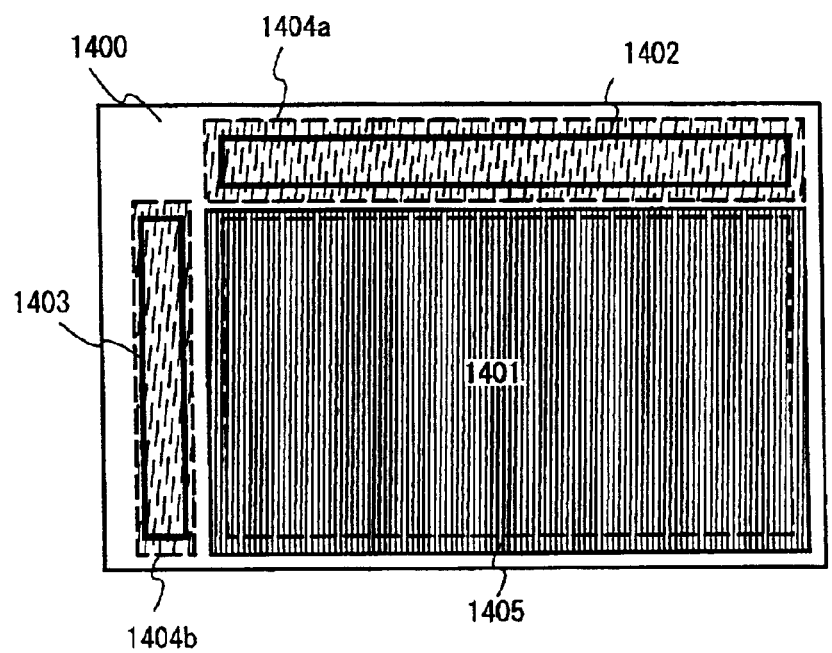
FIGS. 14A–14B illustrate an example of arrangement of pixels of the color filters.
Figure 14B:
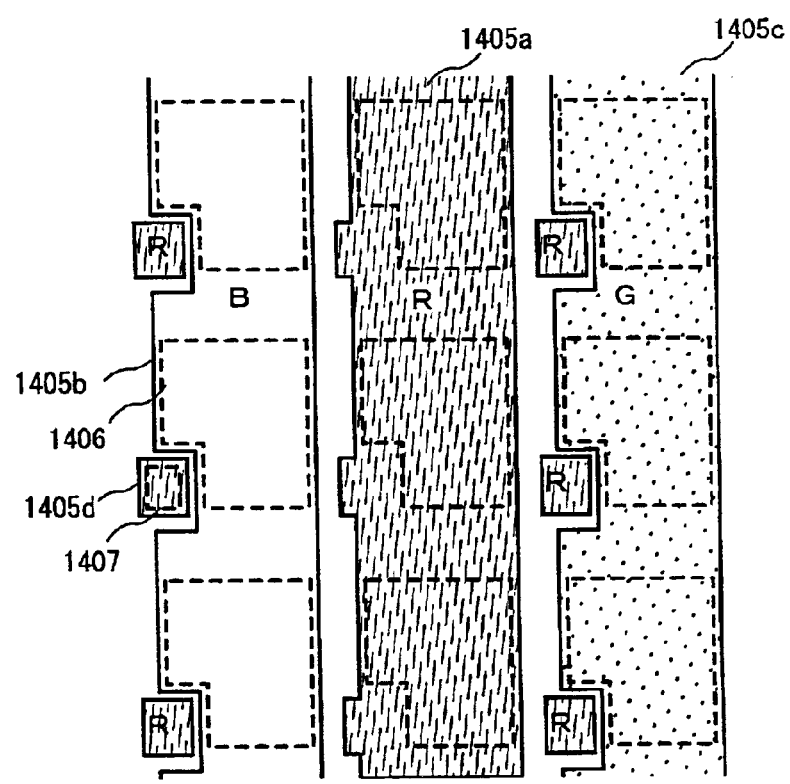

Regarding the color filter 1106 described in Embodiment 6, an example of applying the present invention in a case of using a stripe shape color filter is shown in FIG. 14. FIG. 14A is a top view showing, in brief, an arrangement relationship between a pixel portion 1401, a source line side driving circuit 1402, and a gate line side driving circuit 1403, and color filters 1404 and 1405, formed on a substrate 1400. With the present invention, red color filters (R) 1404a and 1404b are formed on the driving circuits 1402 and 1403 which are peripheral circuits, and prevent light degradation of an active layer of a TFT at the same time as fulfilling a leveling role. Further, a color filter (B) 1405b, a color filter (R) 1405a, and a color filter (G) 1405c are repeatedly arranged in a stripe shape on the pixel portion 1401. A schematic diagram of an enlargement of a portion of pixels (3×3 array) is shown in FIG. 14B. A color filter 1405d for protecting a pixel TFT portion 1407 is formed for each pixel, as shown in FIG. 14B. Note that source lines, gate lines, and electrodes are not shown in the figure here, but they are arranged so as to overlap with the gap between each of the color filters, and therefore light does not leak. The color filters 1405d thus play a role as a black mask, and a heretofore required step of forming a black mask can therefore be omitted. Further, a contact hole for connecting the pixel electrode and the pixel TFT is not shown in the figure here, but in practice the color filter is formed in a layer between the pixel TFT and the pixel electrode, and therefore an opening exists in the contact hole location.

[Embodiment 8]

Embodiment 8 shows an example of arrangement of a color filter which is different from that in Embodiment 7.

Figure 15A:
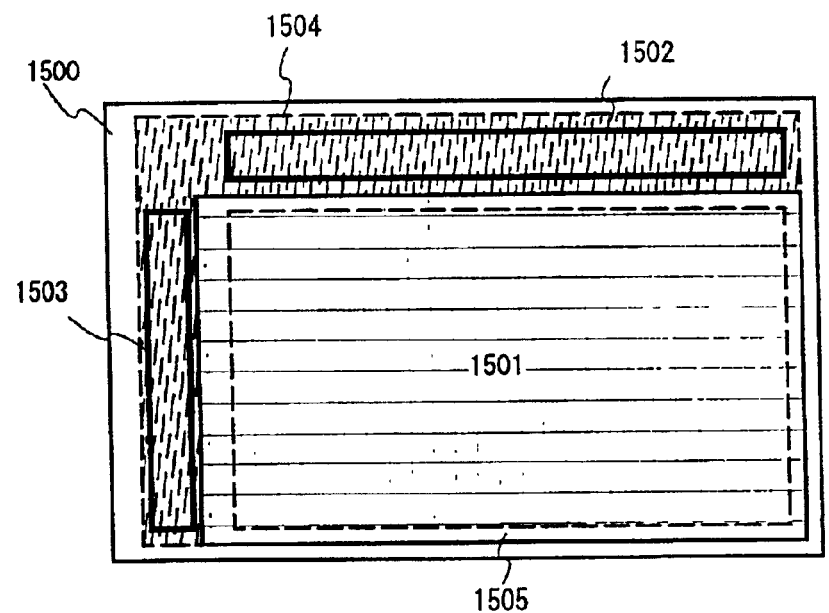
FIGS. 15A–15B illustrate another example of arrangement of pixels of the color filters.
Figure 15B:
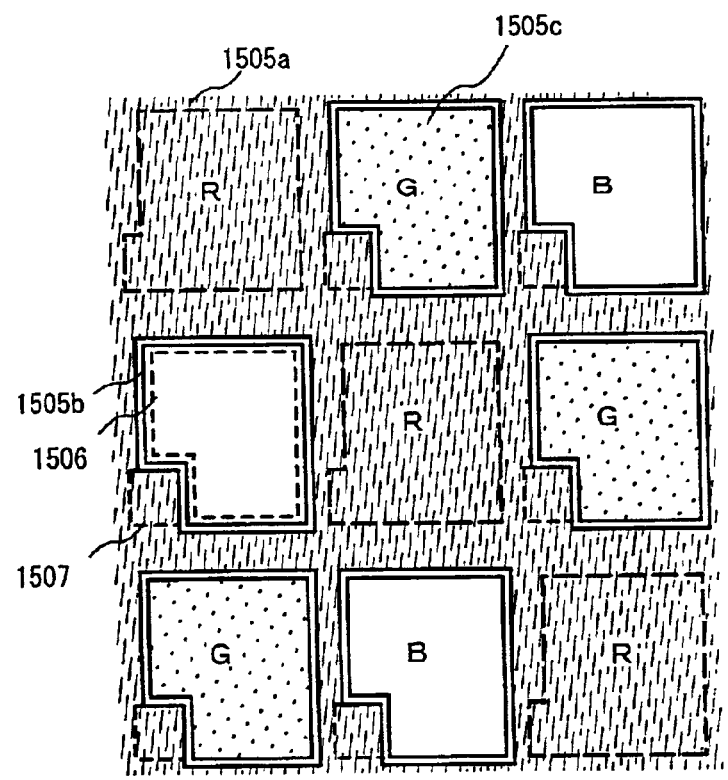

FIG. 15A is a top view showing, in brief, an arrangement relationship between a pixel portion 1501, a source line side driving circuit 1502, and a gate line side driving circuit 1503, and color filters 1504 and 1505a to 1505c, formed on a substrate 1500. With the present invention, a red color filter (R) 1504 is formed on the driving circuits 1502 and 1503 which are peripheral circuits, and this prevents light degradation of an active layer of a TFT at the same time as fulfilling a leveling role. Further, a color filter (B) 1505b and a color filter (G) 1505c are arranged in a matrix shape on the pixel portion 1501, and a color filter (R) 1505a is formed so as to be imbedded in the gap between the color filters 1505b and 1505c. A schematic diagram of an enlargement of a portion of pixels (3×3 array) is shown in FIG. 15B. Color filters 1505a for protecting a pixel TFT portion 1507 are mutually connected, as shown in FIG. 15B. Note that source lines, gate lines, and electrodes are not shown in the figure here, but they are arranged so as to overlap with the gap between each of the color filters, and therefore light does not leak. The color filters 1505a thus play a role as a black mask, and a heretofore required step of forming a black mask can therefore be omitted. Further, a contact hole for connecting the pixel electrode and the pixel TFT is not shown in the figure here, but in practice the color filter is formed in a layer between the pixel TFT and the pixel electrode, and therefore an opening exists in the contact hole location.

[Embodiment 9]

Figure 19:
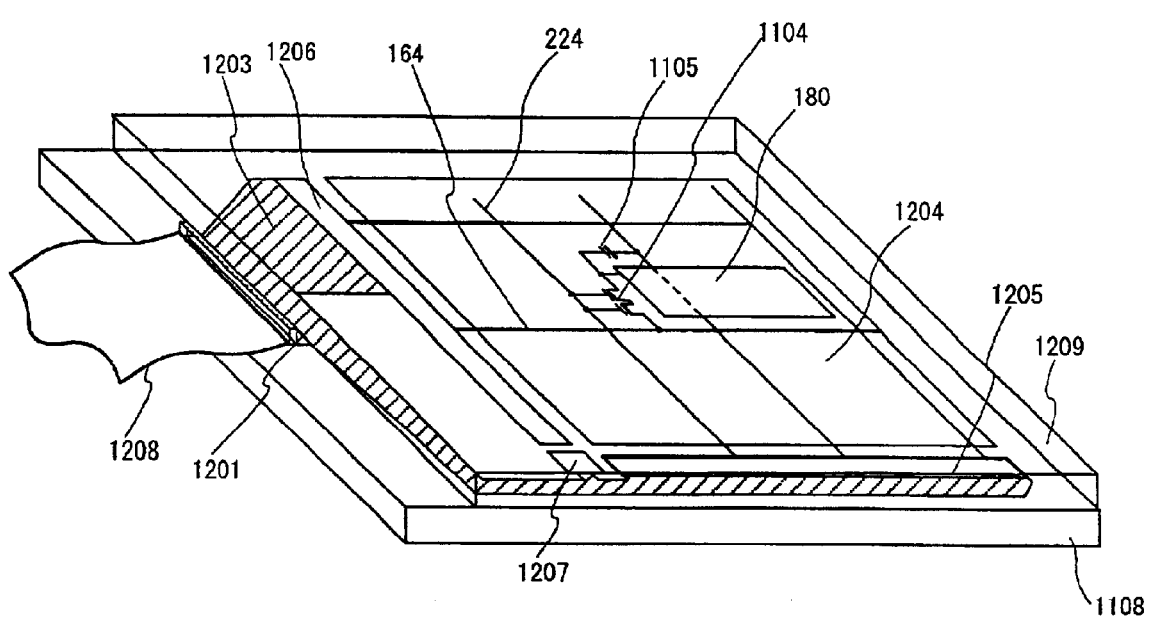
FIG. 19 illustrates the outward appearance of an active matrix type liquid crystal display device according to the present invention.

The construction of such an active matrix liquid crystal display device obtained by using Embodiments 5 to 8, will be explained with reference to the perspective view of FIG. 19. Note that in FIG. 19, the same reference numerals as those of FIGS. 12, 13, and 16 to 18 correspond to each other. In FIG. 19, the active matrix liquid crystal display device comprises the pixel portion 1204, the scanning signal driving circuit 1205, the image signal driving circuit 1206 and other signal processing circuit 1207 formed over the plastic substrate 1108. The pixel TFT 1104 and the storage capacitance 1105 are provided to the pixel portion 1204. The driving circuit disposed in the periphery of the pixel portion comprises the CMOS circuit as the basic circuit. The scanning signal driving circuit 1205 and the image signal driving circuit 1206 are connected to the pixel TFT 1104 by the gate wiring 224 and the source wiring 164. A flexible printed circuit (FPC) 1208 is connected to the external input terminal 1201 and is used for inputting the image signal, and the like. It is connected to the respective driving circuit by connection wiring 1203. Though not shown in the figre, the color filter is disposed on the substrate 1108.

[Embodiment 10]

Examples of an electric device using an EL element are described in Embodiments 1 to 4. Further, the present invention can be used for an EC (Electrochromics) display device, a field emission display (FED), or an electric device comprising a light emission diode using semiconductor.

[Embodiment 11]

CMOS circuits and pixel portions formed in accordance with the present invention can be used in various electric devices (active matrix type liquid crystal display, active matrix type EL display or active matrix type EC display). In other words, the present invention can be applied to all of the electronic equipments having these electric devices as the display section.

The following can be given as examples of this type of an electronic equipment: video cameras; digital cameras; projectors (rear type or front type); head mounted displays (goggle type display); car navigation systems; car stereo; personal computers; portable information terminals (such as mobile computers, portable telephones and electronic notebook). Some examples of these are shown in FIGS. 21 and 22.

FIG. 21A is a personal computer which comprises: a main body 2001; an image input section 2002; a display section 2003; and a key board 2004. The present invention can be applied to the display section 2003.

FIG. 21B is a video camera which comprises: a main body 2101; a display section 2102, a voice input section 2103; operation switches 2104; a battery 2105 and an image receiving section 2106. The present invention can be applied to the display section 2102.

FIG. 21C is a mobile computer which comprises: a main body 2201; a camera section 2202; an image receiving section 2203; operation switches 2204 and a display is section 2205. The present invention can be applied to the display section 2205.

FIG. 21D is a goggle type display which comprises: a main body 2301; a display section 2302; and an arm section 2303. The present invention can be applied to the display section 2302.

FIG. 21E is a player using a recording medium which records a program (hereinafter referred to as a recording medium) which comprises: a main body 2401: a display section 2402; a speaker section 2403; a recording medium 2404; and operation switches 2405. This device uses DVD (digital versatile disc), CD, etc. for the recording medium, and can be used for music appreciation, film appreciation, games and Internet. The present invention can be applied to the display section 2402.

FIG. 21F is a digital camera which comprises: a main body 2501; a display section 2502; a view finder 2503; operation switches 2504; and an image receiving section (not shown in the figure). The present invention can be applied to the display section 2502.

Figure 22A:
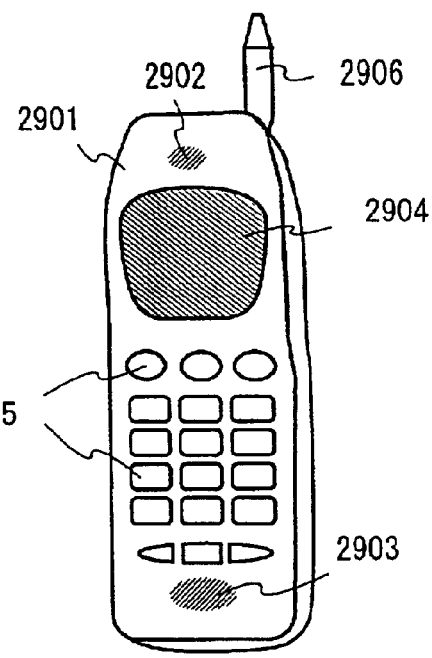
FIGS. 22A–22C illustrate further examples of electronic apparatuses.

FIG. 22A is a portable telephone which comprises: a main body 2901, a voice output portion 2902, a voice input portion 2903, a display section 2904, operation switches 2905, and an antenna 2906. The present invention can be applied to the voice output portion 2902, the voice input portion 2903, the display section 2904.

Figure 22B:
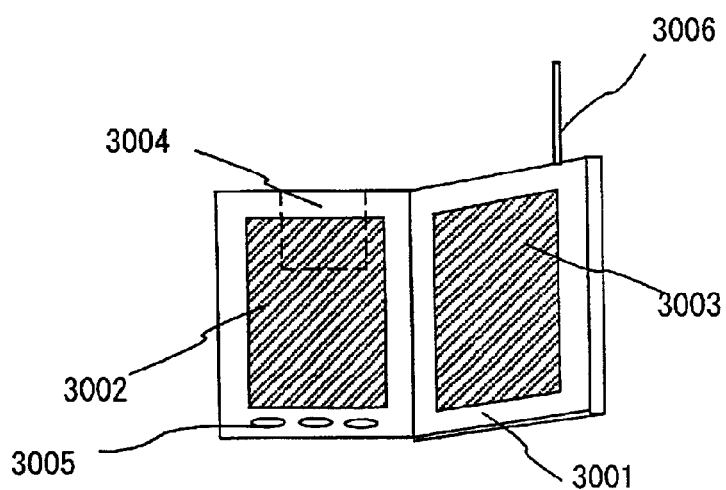

FIG. 22B is a portable electronic book, and it includes a main body 3001, display sections 3002, 3003, a memory medium 3004, an operation switch 3005 and an antenna 3006. The present invention can be applied to the display section 3002 and 3003.

Figure 22C:
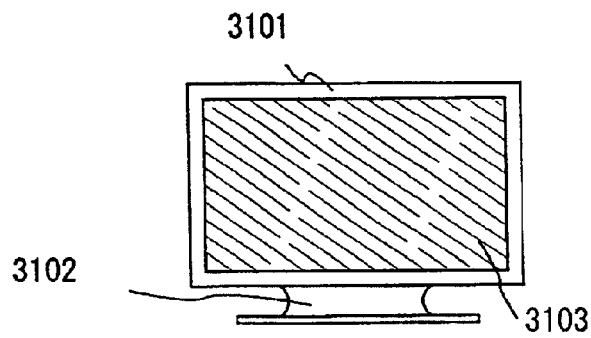

FIG. 22C is a display, and it includes a main body 3101, a support stand 3102, and a display section 3103, etc. The present invention can be applied to the display section 3103. The display of the present invention is advantageous for a large size screen in particular, and is advantageous for a display equal to or greater than 10 inches (especially equal to or greater than 30 inches) in the opposite angle.

As mentioned above, the application range of the present invention is extremely wide, and the invention can be applied to electronic equipments in all fields. Further, any constitution of the electronic equipments shown in embodiments 1 to 10 may be employed in embodiment 11.

According to the present invention, since a substrate (an element forming substrate) having a higher heat resistance than that of plastic is used in the manufacturing process of a semiconductor element, a semiconductor element having excellent electric characteristics can be manufactured. Further, since the element forming substrate is detached after a semiconductor element and a light emitting element are formed and is attached to a plastic support.

Therefore, it is made possible to use a plastic support as the supporting substrate and to manufacture a high performance electric device. Further, since the supporting substrate is plastic, the electric device can be made flexible and light in weight.

Further, by providing color filters between an underlayer film having the semiconductor element and the light emitting element provided thereon and a plastic support, not only is color display accomplished but also the color filters can function as a light shielding film, and thus the reliability of the device can be improved.

What is claimed is:

1. A semiconductor device comprising:
   at least one color filter provided over a substrate;
   an adhesive layer over said substrate and said at least one color filter;
   an insulating film on said adhesive layer; and
   at least one thin film transistor over the insulating film and the at least one color filter; and
   at least one light emitting element over said at least one thin film transistor.

2. A device according to claim 1, wherein said semiconductor device further comprises driver circuits over said insulating film and said at least one color filter, and said driver circuits comprise thin film transistors.

3. A device according to claim 1, wherein the substrate comprises organic material.

4. A device according to claim 1, wherein at least one red color filter of said at least one color filter is provided at position aligned with at least channel forming region of said at least one thin film transistor.

5. A device according to claim 1, wherein said adhesive layer comprises a material selected from the group consisting of polyimide, acrylic, and epoxy resin.

6. A device according to claim 1, wherein a fixing substrate is provided over said at least one thin film transistor so as to face said substrate.

7. A device according to claim 1, further comprising a black mask together with said at least one color filter.

8. A device according to claim 1, wherein said semiconductor device is selected from the group consisting of a video camera, a digital camera, a goggle type display, a car navigation system, a personal computer, and a personal digital assistant.

9. A semiconductor device comprising:
at least one color filter over a substrate;
an adhesive layer over the substrate and the at least one color filter;
an insulating film over said adhesive layer;
at least one thin film transistor over the insulating film and the at least one color filter; and
at least one light emitting element over the at least one thin film transistor,
wherein light emitted from said at least one light emitting element is emitted through said substrate.

10. A device according to claim 9, wherein said substrate is a plastic substrate comprising an organic material.

11. A device according to claim 9, wherein said semiconductor device further comprises driver circuits over said insulating film and the at least one color filter, and said driver circuits comprise thin film transistors.

12. A device according to claim 9, wherein the at least one color filter is provided on said substrate at a position aligned with the at least one thin film transistor.

13. A device according to claim 9, wherein said insulating film covers said at least one color filter, and has a planarized surface.

14. A device according to claim 9, wherein at least one red color filter of said at least one color filter is provided at position aligned with at least channel forming region of said at least one thin film transistor.

15. A device according to claim 9, wherein said adhesive layer comprises a material selected from the group consisting of polyimide, acrylic, and epoxy resin.

16. A device according to claim 9, wherein a fixing substrate is provided over said at least one light emitting element so as to face said substrate.

17. A device according to claim 12, further comprising a black mask together with said at least one color filter.

18. A device according to claim 9, wherein said semiconductor device is selected from the group consisting of a video camera, a digital camera, a goggle type display, a car navigation system, a personal computer, and a personal digital assistant.

19. A semiconductor device comprising:
at least one red color filter provided over a substrate;
an adhesive layer over said substrate and said at least one red color filter;
an insulating film on said adhesive layer; and
at least one thin film transistor over the insulating film and said at least one red color filter; and
at least one light emitting element over the at least one thin film transistor.

20. A device according to claim 19, wherein said semiconductor device further comprises driver circuits on said insulating film and at least one red color filter.

21. A device according to claim 19, wherein the substrate comprises organic material.

22. A device according to claim 19, wherein said adhesive layer comprises a material selected from the group consisting of polyimide, acrylic, and epoxy resin.

23. A device according to claim 19, wherein a fixing substrate is provided over said at least one thin film transistor so as to face said substrate.

24. A device according to claim 19, wherein said semiconductor device is selected from the group consisting of a video camera, a digital camera, a goggle type display, a car navigation system, a personal computer, and a personal digital assistant.

25. A semiconductor device comprising:
at least one color filter over a substrate;
an adhesive layer over the substrate and the at least one color filter;
a first insulating film over said adhesive layer;
at least one thin film transistor over the first insulating film and the at least one color filter;
a second insulating film over said at least one thin film transistor; and
at least one light emitting element over the second insulating film.

26. A device according to claim 25, wherein the substrate comprises organic material.

27. A device according to claim 25, wherein said adhesive layer comprises a material selected from the group consisting of polyimide, acrylic, and epoxy resin.

28. A device according to claim 25, wherein said semiconductor device is selected from the group consisting of a video camera, a digital camera, a goggle type display, a car navigation system, a personal computer, and a personal digital assistant.

29. A semiconductor device comprising:
at least one color filter over a substrate;
an adhesive layer over the substrate and the at least one color filter;
a first insulating film over said adhesive layer;
at least one thin film transistor over the first insulating film and the at least one color filter;
a second insulating film over said at least one thin film transistor;
at least one light emitting element over the second insulating film; and
a passivation film comprising nitride over the at least one light emitting element.

30. A device according to claim 29, wherein the substrate comprises organic material.

31. A device according to claim 29, wherein said adhesive layer comprises a material selected from the group consisting of polyimide, acrylic, and epoxy resin.

32. A device according to claim 29, wherein said semiconductor device is selected from the group consisting of a video camera, a digital camera, a goggle type display, a car navigation system, a personal computer, and a personal digital assistant.

33. A semiconductor device comprising:
a first substrate comprising an organic material;
at least one color filter over the first substrate;
an adhesive layer over the first substrate and the at least one color filter;
a first insulating film over said adhesive layer;
at least one thin film transistor over the first insulating film and the at least one color filter;
a second insulating film over said at least one thin film transistor;
at least one light emitting element over the second insulating film; and
a second substrate comprising an organic material over the at least one light emitting element.

34. A device according to claim 33, wherein said adhesive layer comprises a material selected from the group consisting of polyimide, acrylic, and epoxy resin.

35. A device according to claim 33, wherein said semiconductor device is selected from the group consisting of a video camera, a digital camera, a goggle type display, a car navigation system, a personal computer, and a personal digital assistant.

* * * * *